(12) United States Patent
Kumar et al.

(10) Patent No.: US 8,330,631 B2
(45) Date of Patent: Dec. 11, 2012

(54) BACKGROUND CALIBRATION METHOD FOR FIXED GAIN AMPLIFIERS

(75) Inventors: DVJ Ravi Kumar, Bangalore (IN);
Priyanka Khasnis, Bangalore (IN);
Gururaj Ghorpade, Bangalore (IN);
Theertham Srinivas, Bangalore (IN);
Srinath B. Pai, Padmanabha Nagar (IN);
Vallamkonda Madhuri, Bangalore (IN)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/907,589

(22) Filed: Oct. 19, 2010

(65) Prior Publication Data

US 2012/0119930 A1    May 17, 2012

Related U.S. Application Data

(63) Continuation-in-part of application No. 12/399,797, filed on Mar. 6, 2009, now Pat. No. 7,825,837.

(60) Provisional application No. 61/367,282, filed on Jul. 23, 2010.

(51) Int. Cl.
*H03M 1/10* (2006.01)
(52) U.S. Cl. .................. 341/120; 341/118; 341/155
(58) Field of Classification Search .................. 341/118, 341/120, 155
See application file for complete search history.

(56) References Cited

U.S. PATENT DOCUMENTS

| 4,839,650 | A | 6/1989 | Geen et al. |
| RE34,428 | E | 11/1993 | George et al. |
| 5,305,004 | A | 4/1994 | Fattaruso |
| 5,675,334 | A * | 10/1997 | McCartney .................. 341/118 |
| 5,925,921 | A | 7/1999 | Susak |
| 6,111,529 | A | 8/2000 | Maulik et al. |
| 6,169,502 | B1 | 1/2001 | Johnson et al. |
| 6,198,423 | B1 | 3/2001 | Yu |
| 6,222,471 | B1 | 4/2001 | Nagaraj |
| 6,590,517 | B1 | 7/2003 | Swanson |
| 6,642,871 | B2 | 11/2003 | Takeyabu et al. |
| 6,653,967 | B2 * | 11/2003 | Hamashita .................. 341/172 |
| 6,697,003 | B1 | 2/2004 | Chen |
| 6,714,886 | B2 | 3/2004 | Sung et al. |

(Continued)

OTHER PUBLICATIONS

Trevor C. Caldwell et al., "An Incremental Data Converter with an Oversampling Ratio of 3," ©2006 IEEE, pp. 125-128.

(Continued)

*Primary Examiner* — Khai M Nguyen
(74) *Attorney, Agent, or Firm* — Andrew S. Viger; Wade J. Brady, III; Frederick J. Telecky, Jr.

(57) ABSTRACT

A method for calibrating a fixed gain amplifier configured as a front-end amplification stage of an analog-to-digital converter including sampling a calibration voltage with normal and inversed polarity and with the fixed gain amplifier bypassed and with the fixed gain amplifier connected. An actual gain value of the fixed gain amplifier is computed from offset corrected digital output codes generated from converting the calibration voltage. A gain correction value for the fixed gain amplifier can then be computed based on the ratio of the actual gain to the ideal gain. In another embodiment, a method for calibrating an analog-to-digital converter including a fixed gain amplifier, an input buffer and a modulator generates an offset correction value using normal and polarity inversed input samples. The offset correct value provides correction for at least offset errors in the fixed gain amplifier, the input buffer and the modulator.

19 Claims, 17 Drawing Sheets

U.S. PATENT DOCUMENTS

| | | | |
|---|---|---|---|
| 6,891,486 | B1 | 5/2005 | Pentakota et al. |
| 6,897,673 | B2 | 5/2005 | Savage et al. |
| 6,954,169 | B1 * | 10/2005 | Min ............................ 341/172 |
| 7,002,504 | B2 | 2/2006 | McMahill |
| 7,084,804 | B1 | 8/2006 | Engel |
| 7,098,823 | B2 * | 8/2006 | O'Dowd et al. .............. 341/118 |
| 7,170,439 | B1 | 1/2007 | Chen |
| 7,358,876 | B1 * | 4/2008 | Oo et al. ....................... 341/118 |
| 7,378,999 | B1 | 5/2008 | McGrath et al. |
| 2003/0184459 | A1 | 10/2003 | Engl |
| 2004/0183560 | A1 | 9/2004 | Savage et al. |
| 2005/0116847 | A1 | 6/2005 | Pentakota et al. |
| 2005/0280566 | A1 | 12/2005 | Seki |
| 2009/0058698 | A1 | 3/2009 | Chen |

OTHER PUBLICATIONS

International Search Report and Written Opinion, 10 pages, Dec. 14, 2011.

QF4A512 "4-Channel Programmable Signal Converter (PSC)," Quick Filter Technologies, Jan. 2007, downloaded from http:/www.quickfiltertech.com, p. 1-64.

Alma Delić-Ibukić, "Digital Background Calibration Techniques for High-Resolution, Wide Bandwidth Analog-to-Digital Converters," A thesis, Requirement Degree of Doctor of Philosophy in Electrical Engineering, University of Maine, Aug. 2008, downloaded from http:/www.eece.maine.edu/-hummels/thesis/adi__phd_08.pdf, 202 pages.

* cited by examiner

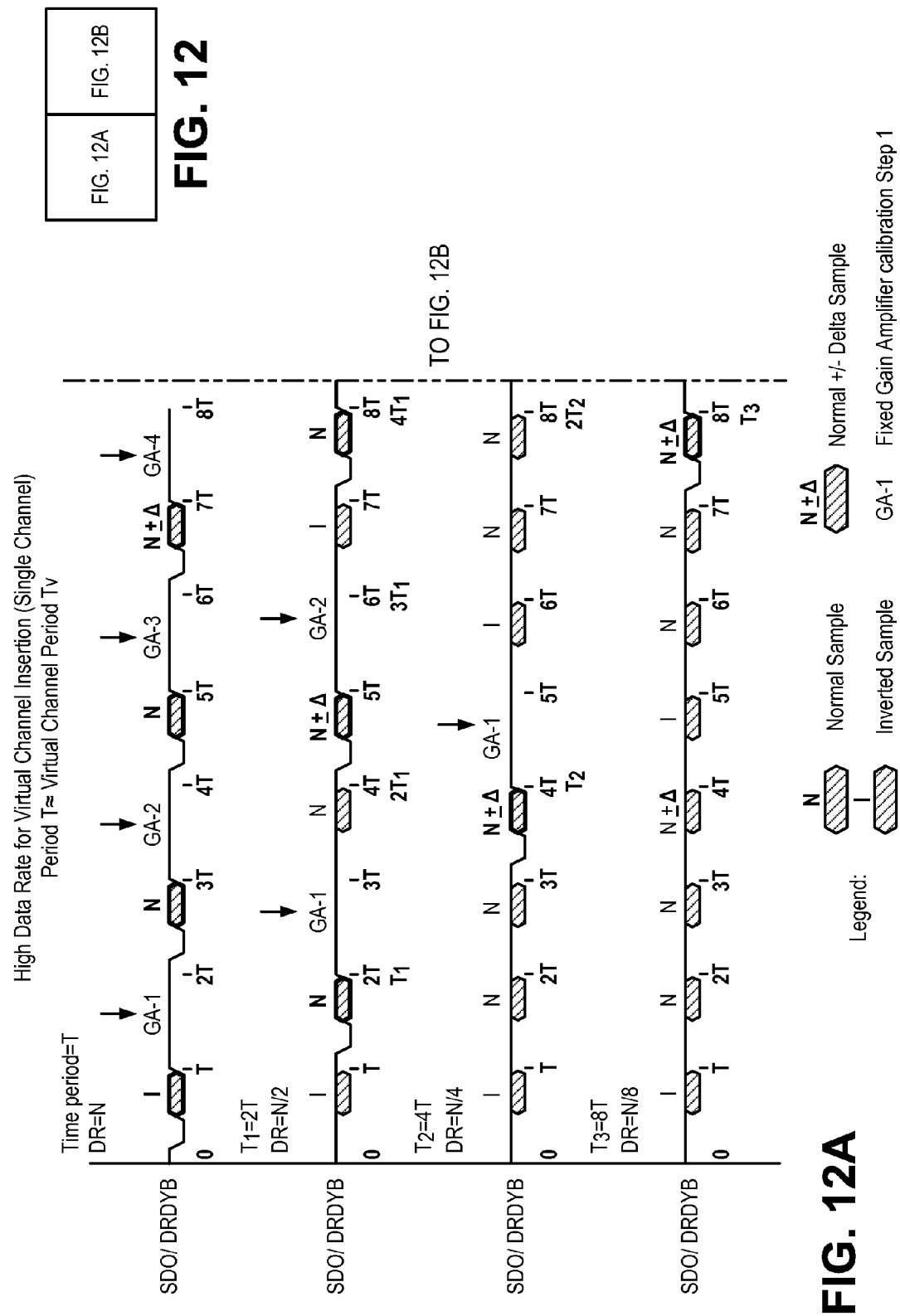

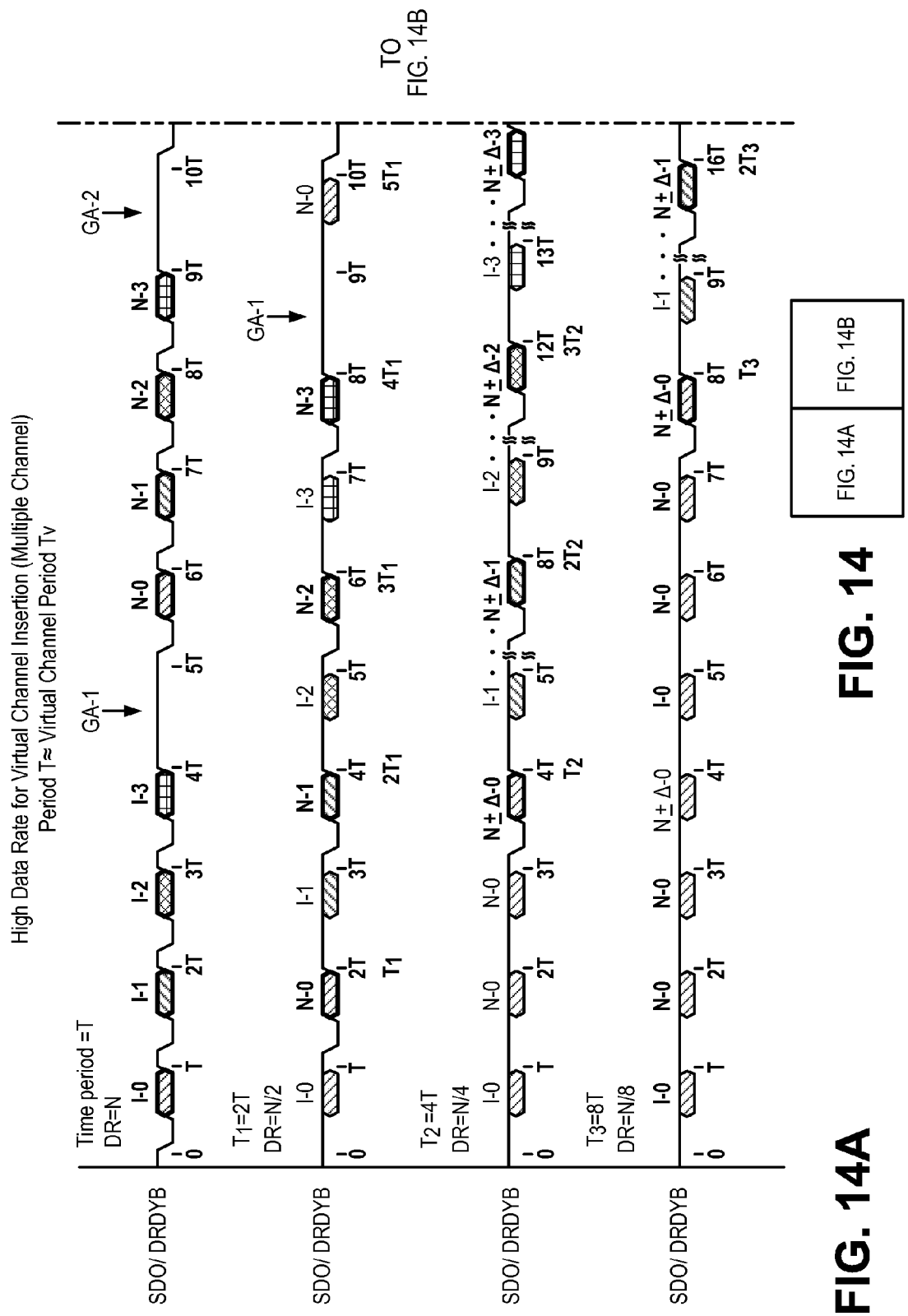

BACKGROUND CALIBRATION METHOD FOR FIXED GAIN AMPLIFIERS

CROSS-REFERENCE TO RELATED APPLICATION

This application claims the benefit of U.S. Provisional Patent Application Ser. No. 61/367,282, filed on Jul. 23, 2010, of DVJ Ravi Kumar et al., which application is incorporated herein by reference in its entirety.

This application is a continuation-in-part of application Ser. No. 12/399,797, now U.S. Pat. No. 7,825,837, filed Mar. 6, 2009, entitled "Background Calibration Method For Analog-to-Digital Converters," of the same inventors hereof, which patent application is incorporated herein by reference in its entirety.

FIELD OF THE INVENTION

The invention relates to fixed gain amplifiers and, in particular, to a background calibration method for fixed gain amplifiers used as a front-end amplification stage to analog-to-digital converters (ADCs) where the calibration is performed with minimal interruption to the ADC operation or minimal effect on the data rate of the ADC.

DESCRIPTION OF THE RELATED ART

Analog-to-digital converters (ADCs) are used in converting or digitizing an analog input signal to generate a digital output signal indicative of the value of the analog input signal within a given conversion time. Various topologies for ADCs are known, such as pipeline ADCs, delta-sigma ADCs and incremental ADCs, and the different ADC topologies are used for different applications. For example, incremental ADCs are used in applications where very high absolute accuracy and linearity and very low offset and noise are required. An incremental ADC includes a sigma-delta ($\Sigma\Delta$) modulator as the analog front end and digital post processing circuitry as the digital back end. The modulator samples the analog input signal, such as an input voltage generated by the input sensor (temperature sensor, weight sensor), and generates a digitized data stream representative of the magnitude of the analog input signal. The digital post processing circuitry of an incremental ADC may include digital filters (such as a finite impulse response FIR filter) and counters for processing the digitized data stream. The digital post processing circuitry generates a digital value being an estimate of the average magnitude of the analog input signal during a given time interval. In operation, an incremental ADC operates for a predetermined number of clock periods (approx. 512-10000) while sampling the analog input signal. At the end of the conversion cycle, a digital value indicative of the sampled input signal is generated and the ADC is reset. An incremental ADC is therefore considered to be a $\Sigma\Delta$ ADC operated in the transient mode.

Conventional incremental ADCs suffer from offset, gain and non-linearity errors. Furthermore, drifts in these error values over time or temperature variations render these errors even more noticeable and problematic. Offset, gain and non-linearity errors in these high resolution converters need to be minimized in order for the ADC to meet the requirement of high absolute (DC) accuracy. Thus, digital background calibration is employed to calibrate for these errors.

One conventional background calibration technique for incremental ADCs involves disconnecting the differential inputs from the input signals and shorting the differential inputs together to obtain an offset correction factor. For gain error, the conventional calibration technique operates by applying a positive full-scale reference voltage to the differential inputs to obtain a gain correction factor. The offset correction factor thus obtained is subtracted from the result of each conversion to remove the offset error. The offset corrected digital output codes are multiplied by the gain correction factor to calibrate out the gain error.

The conventional calibration techniques for ADCs are not truly background calibration techniques as the ADC has to cease sampling the input signals to allow the offset and gain calibration to take place. The data rate of the ADC is thus affected by the calibration operation. In some cases, a data rate reduction up to a factor of 6 results due to the calibration process. Furthermore, the conventional calibration techniques can only calibrate for a gain factor of 1 because the full-scale reference voltage for other gain factors is not readily available. In addition, the conventional calibration techniques do not calibrate for higher order non-linearity errors.

FGA (Fixed Gain amplifiers) are often used as front-end gain stage of an ADC. The purpose of the FGA is to amplify weak signals coming in from the analog sources, such as sensors, and then provides the amplified signals to the ADC modulator for conversion from analog to digital domain. The FGA can experience significant offset and gain error during the amplification process. Also, drift in offset and gain error values due to time and temperature introduces noticeable errors in the digital conversion results. Often, ADCs are used in applications requiring very high absolute accuracy and linearity, and very low offset and noise such as, weigh scales and sensors. Accordingly, the FGA also has to comply with the requirements of high absolute accuracy and linearity of the ADC it is incorporated with. Thus, errors from the FGA need to be minimized in order to satisfy the requirement of high absolute (DC) accuracy in the high resolution analog-to-digital converters.

BRIEF DESCRIPTION OF THE DRAWINGS

FIG. 12, which includes FIGS. 12A and 12B, illustrates exemplary input samples and the data ready signal for input sequences that can be used to interleave modulator and FGA gain and offset estimations for a single channel ADC (High Data Rate) according to one embodiment of the present invention.

FIG. 13, which includes

DETAILED DESCRIPTION OF THE PREFERRED EMBODIMENTS

Figure 1:
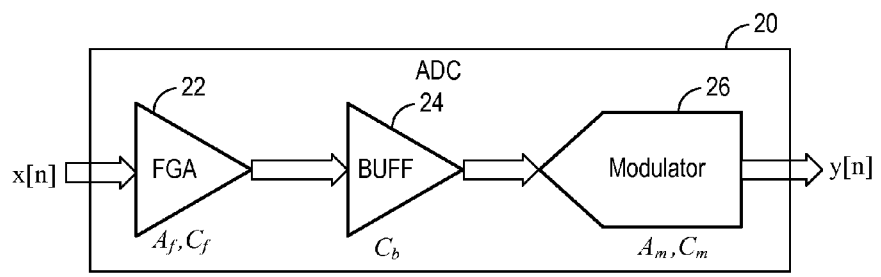
FIG. 1 is a block diagram of an analog-to-digital converter according to one embodiment of the present invention.

According to the principles of the present invention, a background calibration method and circuit for a fixed gain amplifier (FGA) operate to estimate the gain of the FGA with high accuracy and precision. The background calibration method of the present invention operates continuously to correct for FGA gain errors. In some embodiments, the FGA is coupled as a front-end amplification stage of an analog-to-digital converter (ADC). The background calibration method can be carried out continuously with a minimal impact on the data rate of the ADC.

In some embodiments, a calibration voltage is generated internal to the FGA circuit for performing the FGA gain estimation. The need for a precision external reference voltage is thus eliminated. When an external voltage reference is used, the accuracy of the gain estimation is limited by the accuracy of the external voltage reference. By using an internal reference, the gain correction factor can be calculated and stored in an internal memory and thus FGA gain errors can be corrected at the manufacturing line itself.

Furthermore, in some embodiments, the FGA is the front-end amplification stage of an ADC and the gain calibration is performed by applying the calibration voltage and measuring the ADC output signal with the FGA being turned off, or bypassing the FGA, and then applying the calibration voltage and measuring the ADC output signal with the FGA being turned on. The actual gain of the FGA is estimated by taking the ratio of the two ADC output signals. A gain correction factor is calculated by dividing the ideal gain of the FGA by the actual gain computed from the ratio of the two measurements. The gain correction factor can then be applied to the digital output codes of the ADC to calibrate for FGA gain errors. In some embodiments, the gain correction factor is filtered to remove noise in the gain estimation. The FGA gain calibration requires the FGA input to be interrupted for a short while. However, as long as the FGA gain estimation is performed at the highest possible data rate, impact on the ADC output data rate is minimized.

Before the gain correction factor is computed, the offset error of the FGA is estimated and corrected. The FGA offset calibration is performed by applying two samples of the calibration voltage to the FGA, one sample with reversed polarity, and measuring the ADC output signals. An FGA offset error can be computed from the average of the two output samples. Alternately, an offset corrected ADC output can be obtained by taking the difference of two output samples with normal and reverse polarity calibration voltages. The offset correct ADC outputs can then be used for FGA gain estimation. Accordingly, FGA offset errors, if any, do not corrupt the FGA gain estimation.

According to another aspect of the present invention, a background calibration method and circuit operates to estimate the offset errors in the complete signal path of the ADC including the FGA and the modulator of the ADC. The system offset calibration is performed by reversing the polarity of alternate samples of the input signal to the FGA and measuring the ADC output signals. An offset error is computed from the average of the two output samples. The system offset calibration is performed entirely in the background operation of the ADC and does not affect normal ADC operations.

According to yet another aspect of the present invention, the FGA gain error estimation is performed together with the modulator gain estimation and system offset estimation in an interleaving manner to estimate and calibrate for the gain and offset errors in the entire ADC signal path. The interleaving calibration can be carried out on a continual basis to provide updated gain and offset correction factors. The interleave calibration method can be applied to a single channel ADC or a multi-channel ADC. The interleaving is carried out such that the background calibration has minimal impact on the data rate of the ADC.

The background calibration method of the present invention is applicable in ADCs that are converting a slowly varying analog input signal such that the analog input signal can be deemed approximately DC. More specifically, when the analog input signal is slowly varying, or approximately DC, two consecutive input samples of the analog input signal can be considered to be the same or nearly the same. The background calibration method and circuit of the present invention can be applied to sigma-delta (ΣΔ) ADCs having any topology but has particular application in incremental ADCs. Incremental ADCs are high resolution ADCs used to convert a slowly varying analog signal, such as the ambient temperature and weight. For an 18-bit resolution of the ADC, the input signal should not be varying greater than a sinusoidal signal of ~50 µHz.

In some embodiments, the background calibration method of the present invention is implemented in an incremental ADC. The incremental ADC includes a sigma-delta (ΣΔ) modulator as the analog front end and a digital post processing circuit as the digital back end. The ΣΔ modulator samples the analog input signal, such as an input voltage generated by the input sensor, and generates a digitized data stream of digital output codes representative of the magnitude of the samples of the analog input signal. More specifically, a digital output code is generated for each sample of the analog input signal. The digital post processing circuit includes a digital filter, such as a finite impulse response (FIR) filter, and a counter for processing the digitized data stream of digital output codes. The digital post processing circuit generates a digital value being an estimate of the average magnitude of the analog input signal over a given time interval. In operation, the incremental ADC operates for a predetermined number of clock periods—the conversion cycle—to sample the analog input signal. At the end of the conversion cycle, the ADC is reset. A digital value indicative of the average magnitude of the sampled analog input signal over the conversion cycle is generated. In one embodiment, the ΣΔ modulator is a 3rd order modulator. In other embodiments, the ΣΔ modulator can have other configurations, such as ΣΔ modulators of any order.

ADC System Overview

FIG. 1 is a block diagram of an analog-to-digital converter according to one embodiment of the present invention. Referring to FIG. 1, an ADC 20 includes a fixed gain amplifier (FGA) 22, an input buffer 24, and a modulator 26. ADC 20 may include other elements not shown in the block diagram of FIG. 1 to complete the converter function. For instance, when ADC 20 is an incremental ADC, ADC 20 includes a sigma-delta (ΣΔ) modulator as the analog front end and a digital post processing circuit as the digital back end. The digital post processing circuit is not shown in FIG. 1 for simplicity. ADC circuit 20 digitizes the analog input signal x[n] and generates a digital output code y[n] indicative of each sampled analog input signal x[n]. More specifically, FGA 22 receives analog input samples x[n] from an analog data source and applies a fixed gain of $A_f$ to the input samples. Input buffer 24 is a unity gain buffer and applies a gain of 1 to the amplified input samples from FGA 22. Modulator 26 receives the buffered and amplified input samples for digital conversion and generates digital output codes y[n] with a gain of $A_m$.

First, ADC 20 is analyzed for gain errors by assuming that the ADC system does not have any offset error or that any offset errors have been calibrated for. Assuming that ADC 20 has an ideal gain of A, the input-output characteristics of the ADC 20 is given as:

$$y[n]=A \cdot x[n].  \qquad \text{Eq. (1)}$$

However, in the presence of gain error, the input-output characteristics of the ADC becomes:

$$y[n]=A_e \cdot x[n],  \qquad \text{Eq. (2)}$$

where $A_e$ is the actual gain (with gain error) of the ADC signal path. In the present description, it is assumed that the input buffer 24 does not have any gain error. Then, the actual gain $A_e$ of the ADC is the product of the actual gain of the FGA 22 and the modulator 26, given as:

$$A_e = A_f \times A_m \qquad \text{Eq. (3)}$$

where $A_f$ and $A_m$ denote the actual gain (with gain error) of the FGA and the modulator, respectively. In one embodiment, the background calibration method of the present invention operates to estimate the FGA gain so as to eliminate the gain errors introduced by the FGA. In another embodiment, the background calibration method of the present invention utilizes the ADC calibration method described in the parent application Ser. No. 12/399,797, now U.S. Pat. No. 7,825,837, to calibrate for the gain error in the modulator. Thus, by interleaving the gain calibration for the FGA and the gain calibration for the modulator, the gain error for the entire ADC signal path can be estimated and corrected for.

FGA Background Gain Calibration

According to embodiments of the present invention, the background calibration method estimates the gain error of the FGA by taking a first ADC input sample with the FGA turned off and taking a second ADC input sample with the FGA turned on. The actual gain of the FGA is given by the ratio of the two ADC output codes associated with the two ADC input samples. A gain correction factor (or "gain correction value") indicative of the gain error of the FGA is then calculated by dividing the ideal gain of the FGA by the actual gain. The gain correction factor can then be used to calibrate for the digital output codes of the ADC. In one embodiment, the FGA samples an internally generated calibration voltage as the ADC input samples for the purpose of gain calibration.

Figure 2:
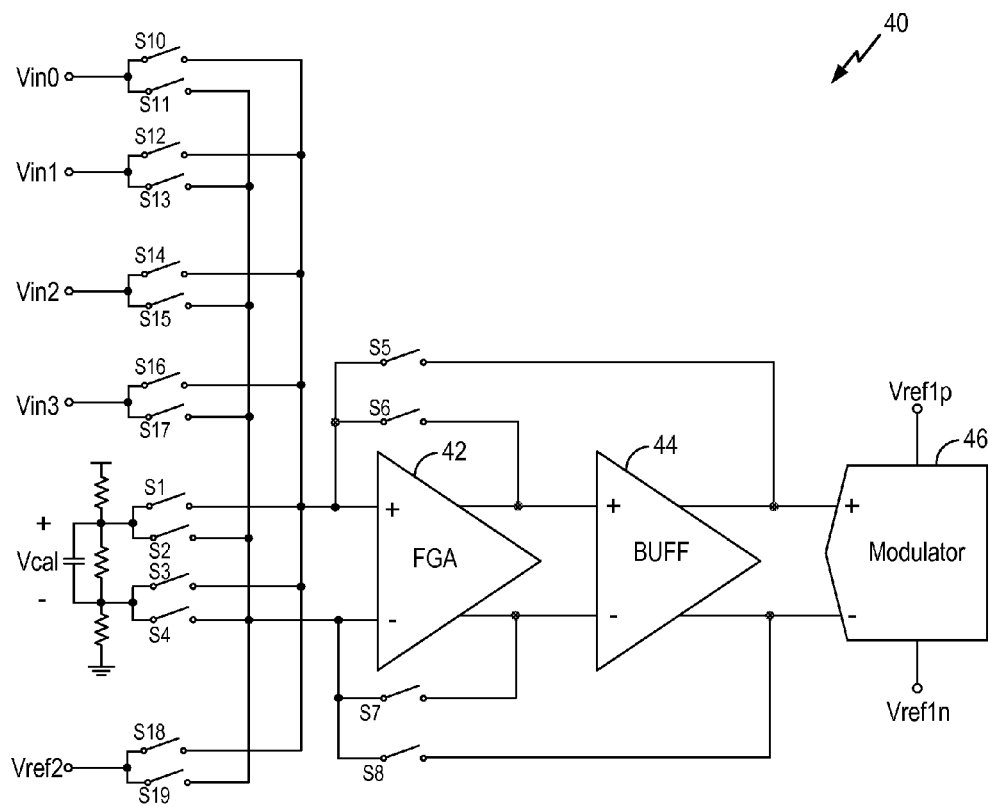
FIG. 2 is a schematic diagram of a multi-channel ADC incorporating a FGA calibration circuit according to one embodiment of the present invention.

FIG. 2 is a schematic diagram of a multi-channel ADC incorporating a FGA calibration circuit according to one embodiment of the present invention. Referring to FIG. 2, in the present embodiment, an ADC 40 is configured to sample four channels of input signals Vin0 to Vin3. The sampled input signal is provided to a fixed gain amplifier (FGA) 42 having a gain $A_f$, an input buffer 44 having unity gain, and a modulator 46 having a gain $A_m$. Switches S10 to S19 operate to connect a selected input signal Vin0 to Vin3 or a reference voltage Vref2 to the differential input terminals of FGA 42 for conversion by the modulator 46. Switches S6 and S7 are connected across the input and output terminals of FGA 42. When switches S6 and S7 are activated, that is, are closed, FGA 42 is bypassed and the input samples go directly to the input buffer 44. Switches S5 and S8 are connected across the input terminals of FGA 42 and the output terminals of input buffer 44. When switches S5 and S8 are activated, that is, are closed, both FGA 42 and input buffer 44 are bypassed and the input samples go directly to the modulator 46. Modulator 46 receives differential reference signals Vref1p and Vref1n.

To facilitate the background gain calibration method of the present invention, ADC 40 includes a calibration circuit to generate a calibration voltage Vcal. In accordance with embodiments of the present invention, calibration voltage Vcal is generated internal to the FGA circuit so that the need for a precision external reference voltage is eliminated. In the present embodiment, calibration voltage Vcal is generated by a resistor divider formed by three resistors connected in series between a positive power supply Vdd and ground. The resistance values for the three resistors are selected to generate the desired voltage value for calibration voltage Vcal. Switches 51 to S4 operate to connect the calibration voltage to either the positive or the negative input terminals of FGA 42 so that either a positive calibration voltage or a negative calibration voltage can be applied to FGA 42. In the present embodiment, a capacitor is connected across the middle resistor of the resistor divider to stabilize or filter the calibration voltage Vcal.

According to embodiments of the present invention, the calibration voltage Vcal is also used in FGA offset calibration. The calibration voltage Vcal with the normal polarity and with reversed polarity are alternately provided to the FGA through switches 51 to S4. For example, switches 51 and S4 are closed to apply a positive voltage Vcal to FGA 42 while switches S2 and S3 are closed to apply a negative voltage Vcal to FGA 42. Offset corrected ADC digital output codes are obtained by taking the difference between the ADC output with normal and reversed polarity Vcal voltages, as will be described in more detail below.

In one embodiment, the voltage value of calibration voltage Vcal is selected so that when the FGA is turned on, the FGA would generate the full-scale voltage for the lowest possible positive power supply Vdd value. In some case, additional voltage margins are provided to the full-scale voltage at the FGA output. When FGA 42 generates a full-scale voltage, input buffer 44 would pass the buffered full-scale voltage to the modulator 46 as input buffer 44 is unity gain. In one embodiment, the calibration voltage Vcal is given as the full-scale output voltage of the FGA divided by the gain of the FGA, evaluated at the minimum Vdd value.

FGA Gain Calibration Implementation

According to embodiments of the present invention, a background FGA gain calibration method for an FGA is implemented in four steps. FIGS. 3-6 illustrate the four steps of the background FGA gain calibration method for the FGA in the ADC of FIG. 2 according to embodiments of the present invention. In FIGS. 3-6, only relevant circuitry for the FGA calibration method is shown. Other circuitry of the ADC circuit are omitted to simplify the discussion.

Figure 3:
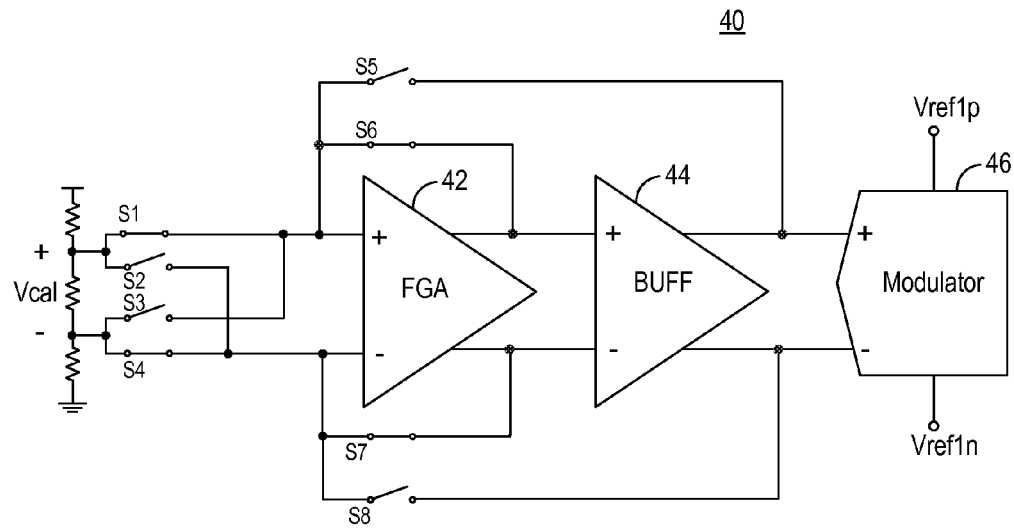
FIGS. 3-6 illustrate the four steps of the background FGA gain calibration method for the FGA in the ADC of FIG. 2 according to embodiments of the present invention.

Referring to FIG. 3, in the first step of the FGA calibration process, the FGA 42 is bypassed by closing switches S6 and S7. Thus, FGA 42 is turned off. The calibration voltage Vcal is applied to the input nodes of FGA 42 by closing switches S1 and S4. The calibration voltage Vcal is of course carried to the input buffer 44 through switches S6 and S7 without any amplification from FGA 42. The digital output code from the modulator 46 is then given as:

$$y_{FGA1} = (Vcal + C_b)A'_m + C_m. \quad \text{Eq. (4)}$$

The first digital output code $y_{FGA1}$ represents the digital output of the calibration voltage Vcal without amplification from the FGA. However, the first digital output code $y_{FGA1}$ includes the offset errors of the input buffer 44 and the modulator 46.

Figure 4:
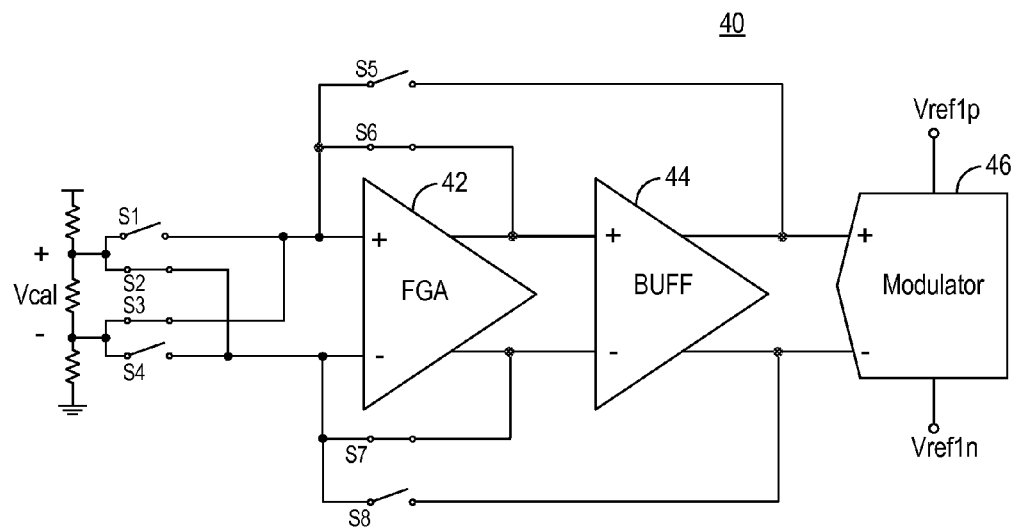

Then, in the second step of the FGA calibration process, the offset errors of the input buffer and the modulator are estimated and eliminated from the first digital output code $y_{FGA1}$ before gain estimation is performed. The offset errors are estimated by reversing the polarity of the calibration voltage while keeping all other system settings to be the same. Referring to FIG. 4, FGA 42 remains bypassed by the closed circuit of switches S6 and S7. The negative calibration voltage –Vcal is applied to the input nodes of FGA 42 by closing switches S2 and S3. The negative calibration voltage –Vcal is of course carried to the input buffer 44 through switches S6 and S7 without any amplification from FGA 42. The digital output code from the modulator 46 is then given as:

$$y_{FGA2} = (-Vcal + C_b)A'_m + C_m. \quad \text{Eq. (5)}$$

The second digital output code $y_{FGA2}$ represents the digital output of the negative calibration voltage –Vcal without amplification from the FGA. However, the second digital output code $y_{FGA2}$ includes the offset errors of the input buffer 44 and the modulator 46.

The first and second digital output codes can then be used to eliminate the offset error in the two ADC measurements. More particularly, the offset corrected digital output code can be obtained by subtracting the two polarity-reversed digital output codes. The offset-corrected digital output code $y_{OFF}$ for the case with FGA 42 being turned off is given as:

$$y_{OFF} = \frac{y_{FGA1} - y_{FGA2}}{2} = Vcal \times A'_m. \quad \text{Eq. (6)}$$

Figure 5:
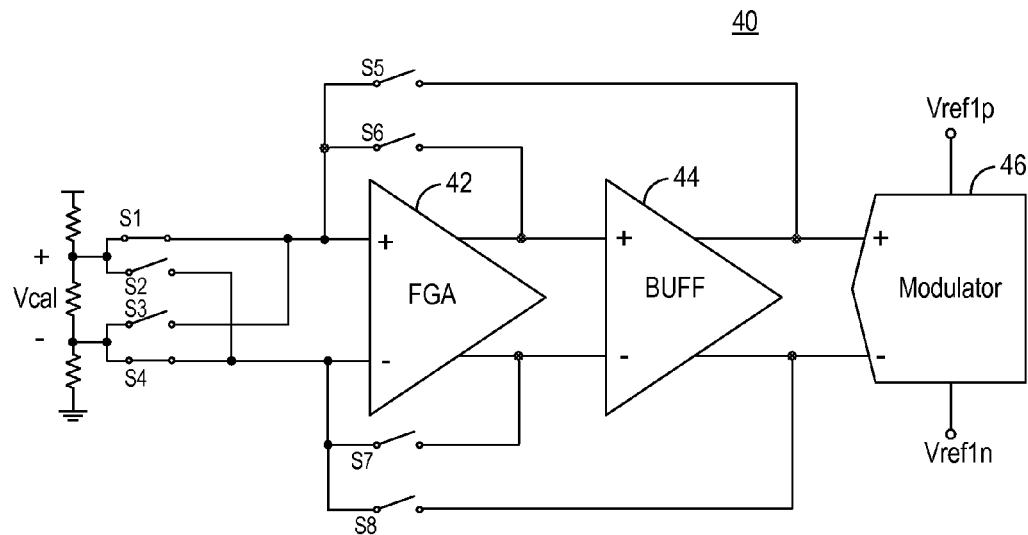

Next, in the third step of the FGA calibration process, as shown in FIG. 5, the calibration voltage Vcal is now converted by the ADC with FGA 42 being turned on. Switches S6 and S7 are open while switches 51 and S4 are closed to supply calibration voltage Vcal to the input nodes of FGA 42. The digital output code from the modulator 46 is then given as:

$$y_{FGA3} = Vcal \times A'_f \times A'_m + (C_f + C_b)A'_m + C_m. \quad \text{Eq. (7)}$$

The third digital output code $y_{FGA3}$ represents the digital output of the calibration voltage Vcal with the amplification from the FGA. However, the third digital output code $y_{FGA3}$ includes the offset errors of the FGA 42, the input buffer 44 and the modulator 46.

Figure 6:
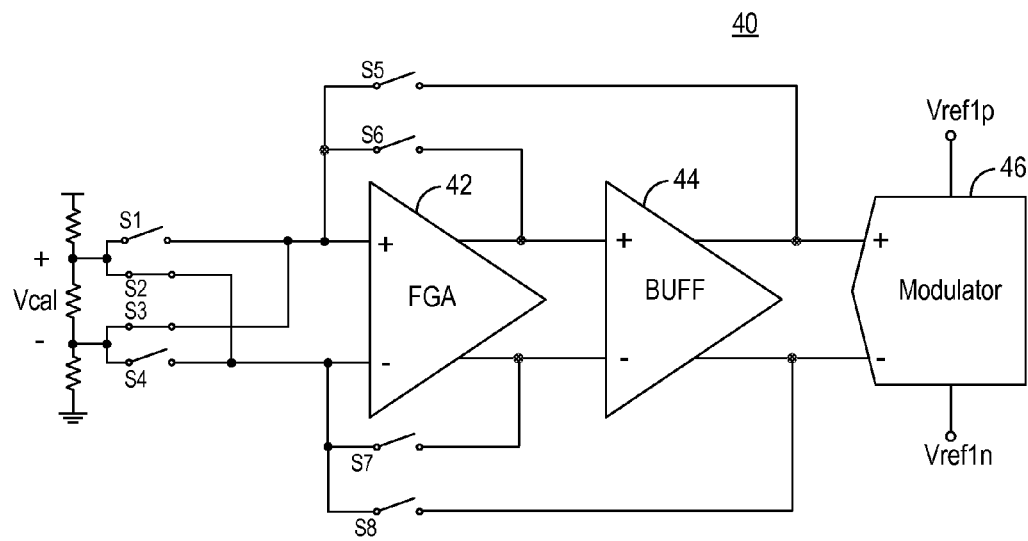

In the fourth and final step of the FGA calibration process, the offset errors of the ADC complete signal path is estimated and eliminated from the third digital output code $y_{FGA3}$ before gain estimation is performed. The offset errors are estimated by reversing the polarity of the calibration voltage while keeping all other system settings to be the same. Referring to FIG. 6, FGA 42 remains turned on and the negative calibration voltage –Vcal is applied to the input nodes of FGA 42 by closing switches S2 and S3. The digital output code from the modulator 46 is then given as:

$$y_{FGA4} = -Vcal \times A'_f \times A'_m (C_f + C_b)A'_m + C_m. \quad \text{Eq. (8)}$$

The fourth digital output code $y_{FGA4}$ represents the digital output of the negative calibration voltage –Vcal with the amplification from the FGA. However, the fourth digital output code $y_{FGA4}$ includes the offset errors of the FGA 42, the input buffer 44 and the modulator 46.

The third and fourth digital output codes can then be used to eliminate the offset error in the ADC measurements. For instance, the offset corrected digital output code can be obtained by subtracting the two polarity-reversed digital output codes. The offset-corrected digital output code $y_{ON}$ for the case with FGA 42 being turned on is given as:

$$y_{ON} = \frac{y_{FGA3} - y_{FGA4}}{2} = Vcal \times A'_f \times A'_m. \quad \text{Eq. (9)}$$

Having completed the FGA calibration process, the gain error of the FGA can now be estimated. The estimated gain $A'_f$ of the FGA 42 can be obtained by taking the ratio of the offset-corrected digital output codes $y_{OFF}$ and $y_{ON}$, as follows:

$$\frac{y_{ON}}{y_{OFF}} = A'_f. \quad \text{Eq. (10)}$$

A FGA gain correction factor $K_f$ is calculated by normalizing the estimated gain $A'_f$ of the FGA with the ideal gain $A_f$, as follows:

$$K_f = \frac{A'_f}{A_f}. \quad \text{Eq. (11)}$$

In one embodiment, the FGA is factory calibrated and the gain correction factors are stored in a non-volatile memory to be accessed by the user. In other embodiments, the FGA is calibrated continuously in real-time to correct for gain and offset errors.

Background System Offset Calibration

According to embodiments of the present invention, the background calibration method estimates the offset error of the complete ADC signal path (referred to as the "system offset error", including the FGA, the input buffer and the modulator, by reversing the polarities of alternate samples of the analog input signal supplied to the ADC. Returning to FIG. 1, each element of an ADC 20 contributes to offset errors in the digital output codes. For instance, in ADC 20, FGA 22 may have an offset error of $C_f$, input buffer 24 may have an offset error of $C_b$ and modulator 26 may have an offset error of $C_m$.

Assuming that ADC 20 has an ideal gain of A and a total offset error of C, the input-output characteristics of the ADC 20 can be written as:

$$y[n]=A \cdot x[n]+C. \quad \text{Eq. (12)}$$

Basically, the digital output code y[n] is the sampled input signal x[n] multiplied by the gain A and summed with the offset C.

The total offset error C for the ADC can be written as:

$$C=(C_f+C_b)A_m+C_m, \quad \text{Eq. (13)}$$

where $A_m$ is the gain of the modulator, as described above.

In embodiments of the present invention, the system offset error of the complete ADC signal path is estimated by reversing the polarities of alternate input samples applied to the ADC. When the polarity of an input sample is reversed, only the linear part of the digitized output signal changes its polarity accordingly but the DC offset of the digital output signal does not change its polarity. The offset error of the ADC signal path is then estimated by averaging two consecutive polarity-reversed digital output codes and an offset correction factor is obtained. The offset correction factor (also referred to as the "offset correction value"), representing the estimated system offset error, is then subtracted from the digital output codes for each input sample to remove the system offset error.

Figures 7, 9:
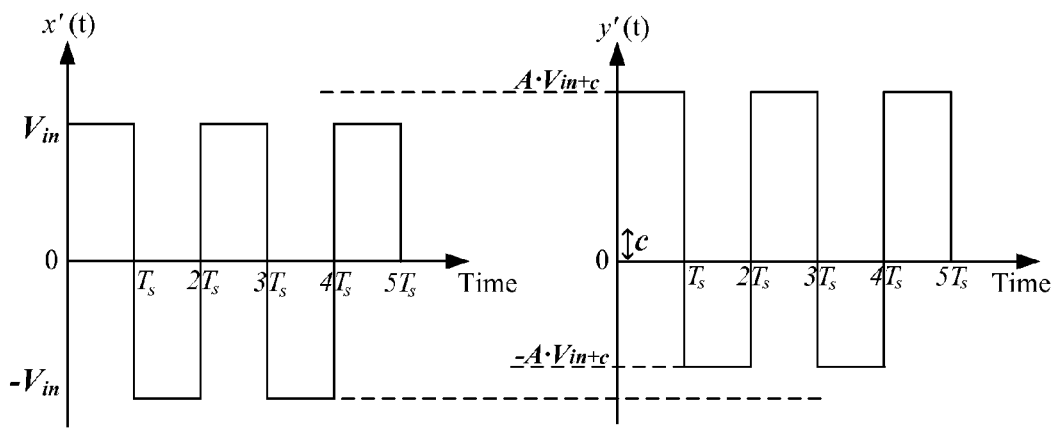
FIG. 7 illustrates exemplary input samples and digital output codes for the original input and output sequence and the modified input and output sequence for offset estimation according to one embodiment of the present invention.
FIG. 9 is a signal diagram illustrating the modified input sample sequence and the corresponding digital output codes for offset estimation in time domain according to one embodiment of the present invention.

FIG. 7 illustrates exemplary input samples and digital output codes for the original input and output sequence and the modified input and output sequence for offset estimation according to one embodiment of the present invention. Referring to FIG. 7, the input sample sequence for the original, unmodified input samples is shown as x[1], x[2], x[3] and x[4] . . . and so on (sequence 52) and the corresponding digital output code sequence is y[1], y[2], y[3] and y[4] . . . and so on (sequence 53). When the offset estimation method in the present embodiment of the present invention is applied, the polarity of alternate input samples to the ADC is reversed. Thus, as shown in FIG. 7, the modified input sample sequence becomes x[1], (−x[2]), x[3], (−x[4]), x[5] . . . and so on (sequence 54). The corresponding digital output codes are represented as y'[n] (sequence 55).

Based on the aforementioned assumption that the analog input signal is changing slowly that any two consecutive samples can be considered to have the same value. Then, an estimation of the offset of the ADC is obtained by averaging any two consecutive or adjacent digital output codes. More specifically, the digital output codes corresponding to two consecutive input samples, one of which has its polarity reversed, and the resultant offset computation are given as follows:

$$y'[1] = A \cdot (x[1]) + C', \quad \text{Eq. (14)}$$
$$y'[2] = A \cdot (-x[2]) + C' \cong A(-x[1]) + C',$$
$$(\text{since } x[2] \cong x[1])$$
$$C' \cong \frac{y'[1] + y'[2]}{2}.$$

The same offset computation can be applied to any pair of digital output codes associated with a pair of input samples having opposite polarities. When the polarity of alternate input samples are reversed, then the digital output codes associated with consecutive pairs of input samples can be used to compute the system offset estimate C' of the ADC. That is, $$C' \cong \frac{y'[1] + y'[2]}{2} = \frac{y'[3] + y'[4]}{2}. \quad \text{Eq. (15)}$$

Figure 8A:
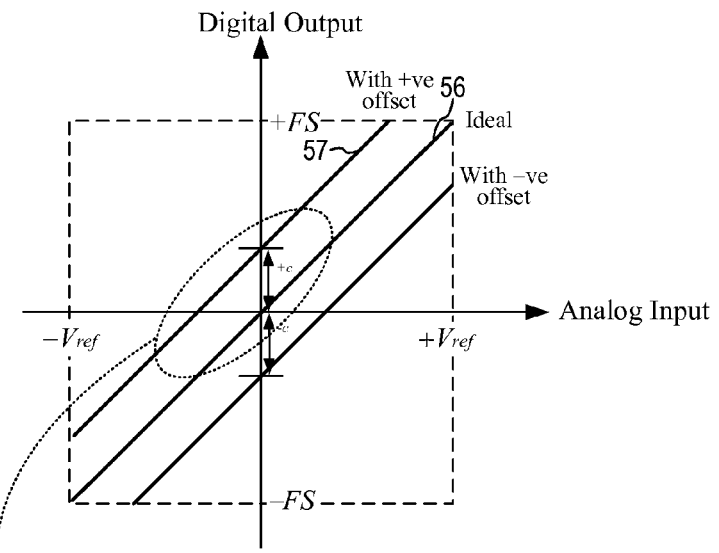
FIGS. 8(a) and 8(b) are graphical representations of the transfer characteristics of the ADC circuit to illustrate the operation of offset estimation according to one embodiment of the present invention.
Figure 8B:
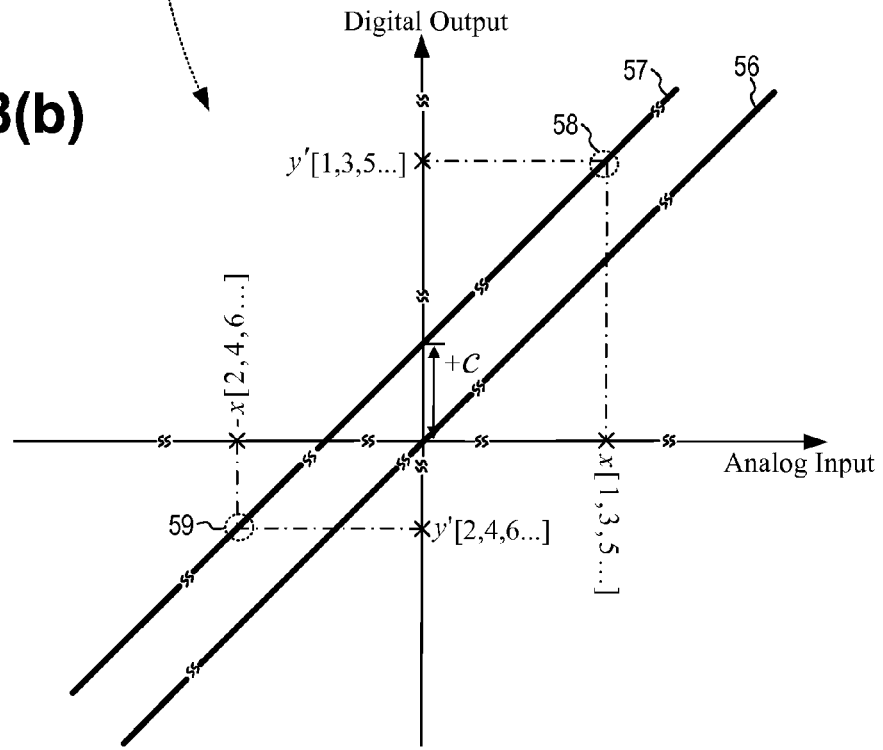

FIGS. 8(a) and 8(b) are graphical representations of the transfer characteristics of the ADC circuit to illustrate the operation of offset estimation according to one embodiment of the present invention. Referring to FIG. 8(a), the ideal ADC transfer characteristic has no offset and the ideal transfer curve 56 crosses the zero origin of the x-y axis. However, the transfer characteristics of the ADC shift vertically up or down with positive offset error or negative offset error, respectively. FIG. 8(b) zooms into the ADC transfer characteristics curve with a positive offset error showing the original and modified input samples, the corresponding digital output codes. Referring to FIG. 8(b), the transfer characteristic 57 of the ADC with positive offset error C is shifted up from the ideal transfer curve 56. When the analog input samples are changing so slowly that they can be considered to have the same values, the analog input samples x[1, 3, 5 . . . ] without polarity inversion yield digital output codes y'[1, 3, 5 . . . ] (at point 58) and the analog input samples x[2, 4, 6 . . . ] with polarity inversion yield digital output codes y'[2, 4, 6 . . . ] (at point 59). As observed from FIG. 8(b), the offset value C can be computed by averaging the digital output codes for an original input sample and for a polarity-reversed input sample.

FIG. 9 is a signal diagram illustrating the modified input sample sequence and the corresponding digital output codes for offset estimation in time domain according to one embodiment of the present invention. Time $T_s$ is the duration of each input sample conversion. Where the original, unmodified input signal is represented as x(t)=$V_{in}$, the modified input sample sequence is represented as x'(t) with alternate samples being polarity reversed, as shown in the graph on the left side of FIG. 9. The digital output of the ADC circuit is y'(t) shown on the right side of FIG. 9. Again, as can be observed from FIG. 9, by averaging two adjacent digital output values associated with a pair of input samples with opposite polarities, the offset error C can be computed.

Figure 10:
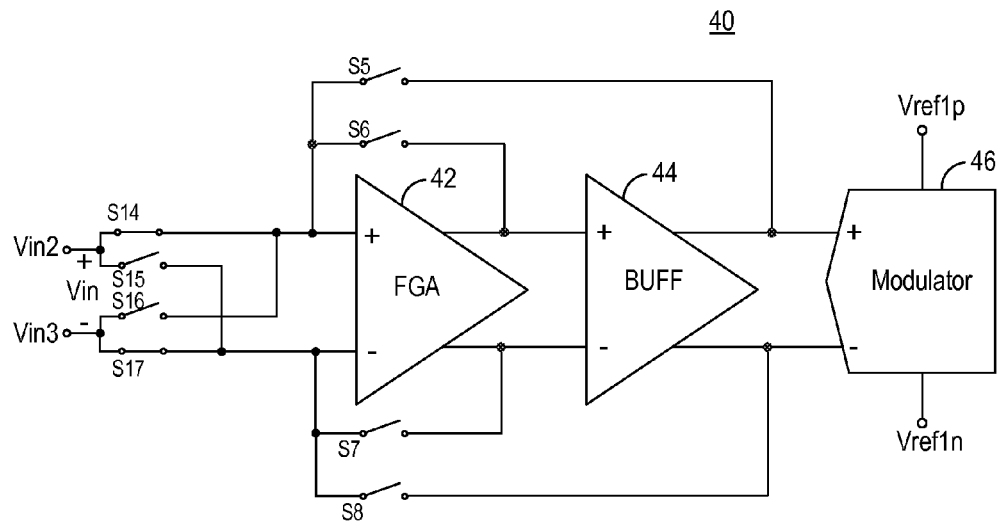
FIGS. 10 and 11 illustrate the two steps of the background system offset calibration method for the ADC of FIG. 2 according to embodiments of the present invention.
Figure 11:
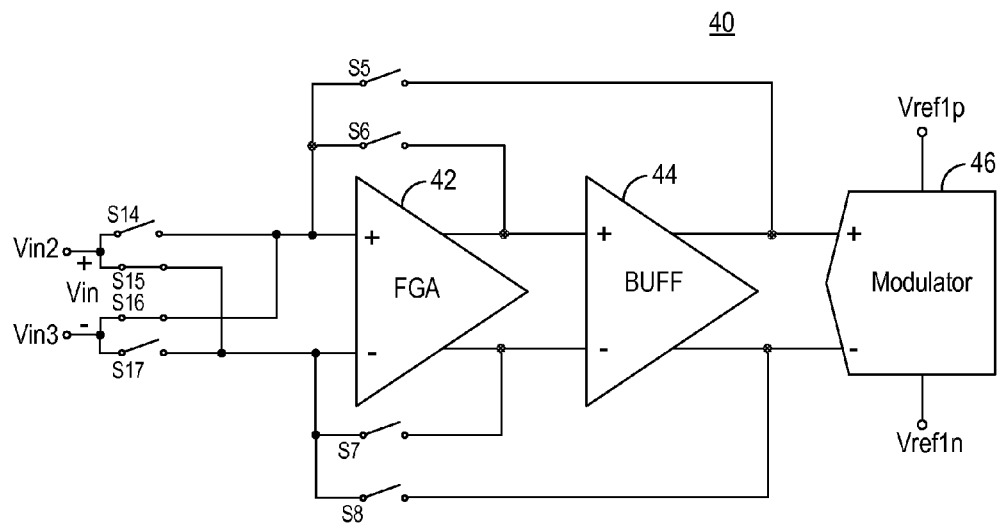

In one embodiment, the background system offset calibration method is implemented in ADC 40 of FIG. 2 to estimate the offset errors in the entire signal path from ADC input to ADC output. Because ADC 40 uses a differential architecture, the system offset calibration is realized by interchanging the differential inputs supplied to the ADC. FIGS. 10 and 11 illustrate the two steps of the background system offset calibration method for the ADC of FIG. 2 according to embodiments of the present invention.

Referring to FIG. 10, an input voltage Vin coupled across the input voltage terminal Vin2 and the input voltage terminal Vin3 is being sampled by ADC 40. The positive input voltage Vin is sampled by closing switches S14 and S17. The digital output code from the modulator is obtained. Then the negative input voltage −Vin is sampled by closing switches S15 and S16. Again, the digital output code from the modulator is obtained. The digital output codes associated with the input samples having opposite polarities are averaged to obtain the system offset error estimate C'.

Once the system offset estimate C' of the ADC is estimated using the offset estimation method described above, subsequent digital output codes can then be calibrated by subtracting the estimated offset as follows:

$$y_{calib}[2] = -(y'[2] - C');$$

$$y_{calib}[3] = y'[3] - C'. \qquad \text{Eq. (16)}$$

An additional advantage of the offset estimation method of the present invention is that since the offset estimation is done by traversing along the ADC transfer characteristics, even order non-linearities of the ADC transfer characteristics are also estimated along with the DC offset. Whereas, in the conventional methods, offset estimation is done by shorting the inputs of the ADC, hence only DC offset is estimated and no information regarding non-linearities of the ADC can be obtained.

ADC System Calibration

In an ADC including a FGA and a modulator, a complete ADC system calibration involves calibrating for the FGA gain and offset errors as well as the modulator gain and offset errors. Estimation of the FGA gain and the ADC system offset errors have been described above. In some embodiments, an ADC system background calibration method of the present invention utilizes the ADC calibration method described in the parent application Ser. No. 12/399,797, now U.S. Pat. No. 7,825,837, to calibrate for the offset and gain errors in the modulator. A gain correction factor Km for correcting the gain error in the modulator can be obtained using the method described in the parent '837 patent. Once the modulator gain error is accounted for, the digital output codes of the ADC can be calibrated for gain and offset errors in the entire ADC signal path.

First, an offset calibrated digital output code can be obtained by subtracting the estimated system offset C', as follows:

$$y_{off\_calib} = y' - C'. \qquad \text{Eq.(17)}$$

The estimated system offset C' can be obtained as described above by averaging digital output codes associated with two input samples with opposite polarities.

Then, the gain corrected digital output code can be obtained by dividing the digital output codes by the gain correction factors, as follows:

$$y_{corrected} = \frac{y_{off\_calib}}{K_f \times K_m}, \qquad \text{Eq. (18)}$$

where modulator gain correction factor $K_m$ is defined as the actual gain over the ideal gain. In Equation (18), the gain correction factors are defined as the ratio of the actual gain over the ideal gain. In that case, the gain corrected digital output code is obtained by dividing the offset calibrated digital output code by the product of the gain correction factors. In other embodiments, the gain correction factors can be defined as the ratio of the ideal gain over the actual gain. In that case, the gain corrected digital output code is obtained by multiplying the offset calibrated digital output code with the product of the gain correction factors.

In operation, the background calibration for the FGA and/or the modulator runs continuously to obtain updated offset and gain error estimates which are stored in registers. The digital output codes are then calibrated using the most recent estimates.

According to embodiments of the present invention, the modulator calibration method, the system offset calibration method and the FGA calibration method are operated in an interleaved manner to realize ADC system calibration. To estimate the modulator gain error, two consecutive input samples are used. To estimate the system offset error, two consecutive input samples are used. In the parent '797 application, methods to interleave the modulator gain and offset calibration using 3 or more input samples are described. As described above, to estimate the FGA gain error, four processing steps using the calibration voltage as the input sample are used. To realize interleaving of modulator calibration and FGA calibration, the FGA calibration steps are inserted in between the input samples used for the modulator calibration. In one embodiment, a virtual channel insertion method is used to insert the four processing steps for the FGA gain calibration in the input samples for the modulator calibration. The insertion of the four processing steps in the input sample operations of the ADC will result in a loss of data rate. Therefore, according to embodiments of the present invention, in order to minimize the data loss and maximize the effective data rate, the virtual channel insertion is always performed at the highest possible data rate.

The interleaving of the modulator calibration steps and the FGA calibration steps can be carried out in many different ways. In the present description, examples of the modulator and FGA calibration interleaving technique will be described with reference to an ADC that can be configured to support multiple data rates and multiple input channels. In some embodiments, an ADC with high data rate and low data rate capabilities provides output data based on a system clock or scaled version of the system clock. Different data rates are obtained by averaging of 2, 4 or 8 output samples to obtain slower data rates. For example, a system clock $f_{clk}$ provides a highest data rate, such as 214.6 sps (samples per second). To obtain the other data rate, the ADC continues to run at the system clock $f_{clk}$ but the output samples are averaged by 2 samples, 4 samples or 8 samples to give data rates of 107.3 sps, 53.66 sps and 26.83 sps, respectively. To realize the low data rate, the system clock $f_{clk}$ is scaled down by a factor of N, such as 16, and multiple data rates are obtained again by averaging the output samples by 2, 4, or 8.

Figure 12B:
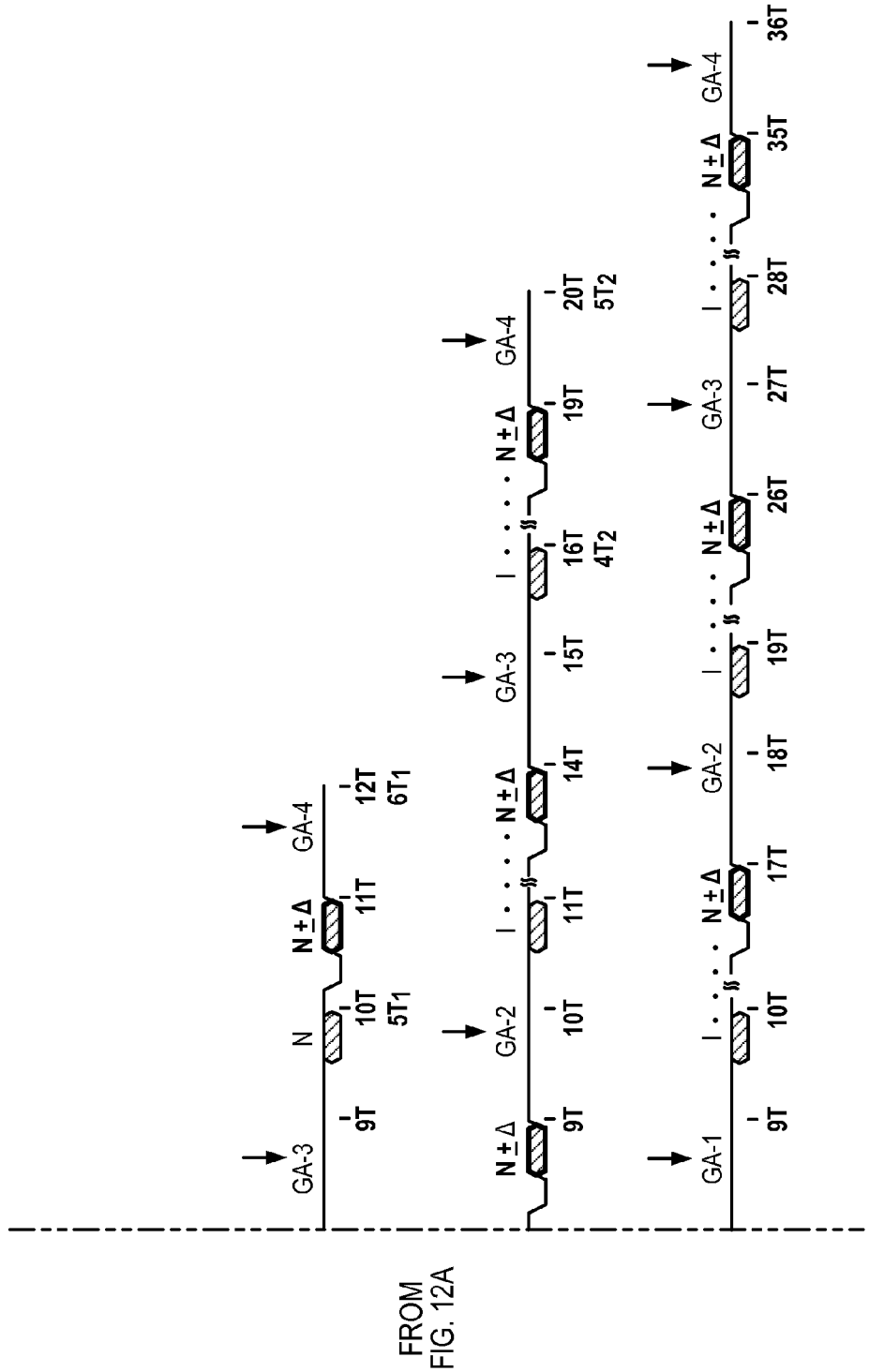

FIG. 12 illustrates exemplary input samples and the data ready signal for input sequences that can be used to interleave modulator and FGA gain and offset estimations for a single channel ADC (High Data Rate) according to one embodiment of the present invention. In FIG. 12, the input samples which are highlighted in bold are processed in the foreground and triggers the data ready signal (DRDYB) and input samples which are unbolded are processed in the background and are invisible to the user.

Referring to FIG. 12, when the ADC operates at a high data rate, the period for virtual channel insertion is about the same as the time period T for a single input sample conversion (T≈Tv). For the highest data rate (DR=N), the samples for the virtual channel (GA-1 to GA-4) are inserted every other input sample. So it takes 8 samples to obtain a single measurement of the gain and offset errors of the modulator and the FGA. Also, the virtual channel insertion results in a 50% reduction in data rate.

For the next data rate (DR=N/2), the converter is still running at the highest data rate and the processing for background calibration is also done at the highest data rate. Accordingly, only 6 samples are needed to obtain a single measurement of the gain and offset errors of the modulator and the FGA. The virtual channel insertion results in a 33% reduction in data rate. For the next two lower data rate (DR=N/4 and N/8), the reduction in data rate will decrease as the virtual channel insertion occupies smaller time slots of the conversion cycle.

Figure 13A:
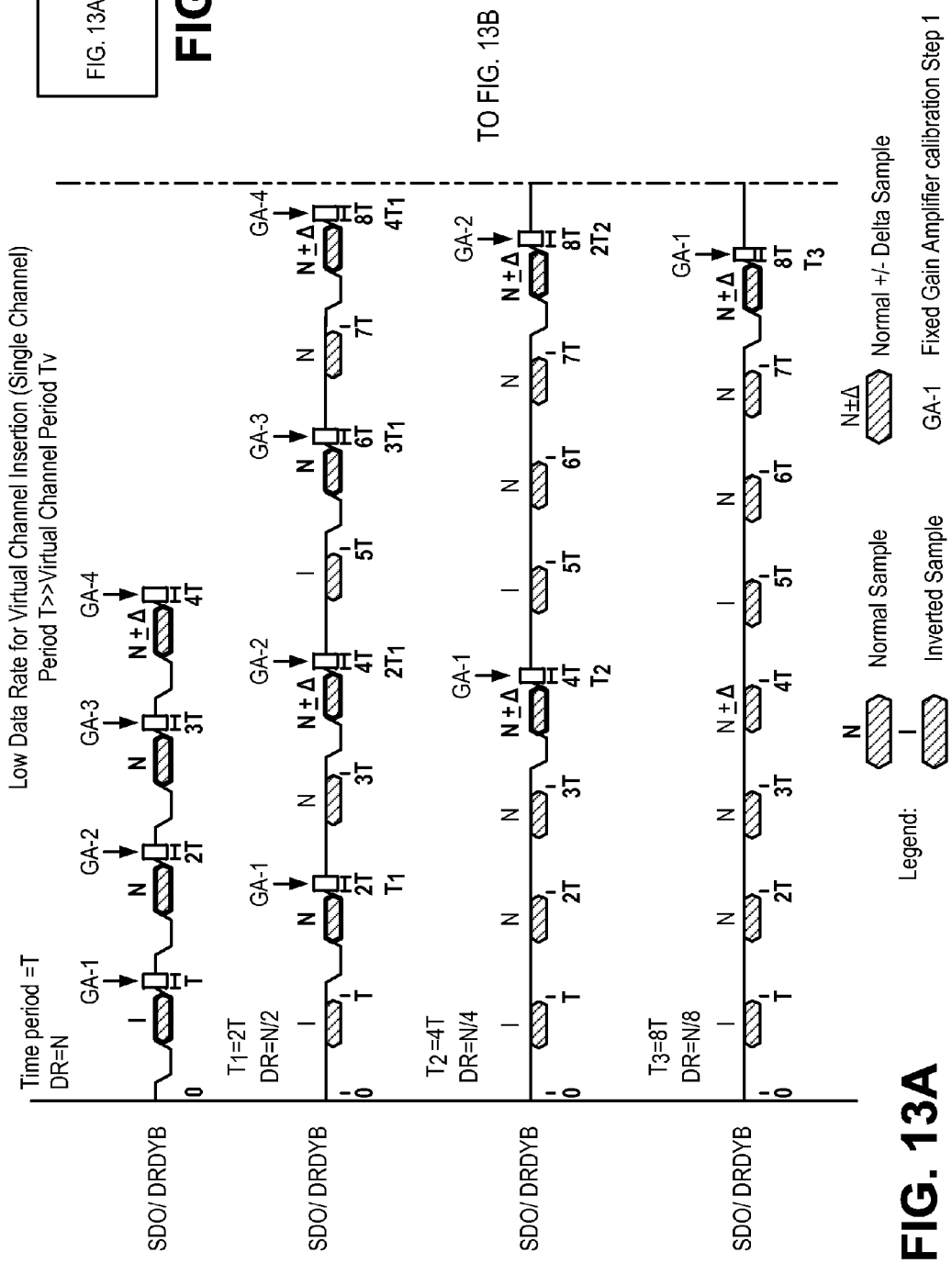
FIGS. 13A and 13B, illustrates exemplary input samples and the data ready signal for input sequences that can be used to interleave modulator and FGA gain and offset estimations for a single channel ADC (Low Data Rate) according to another embodiment of the present invention.
Figure 13B:
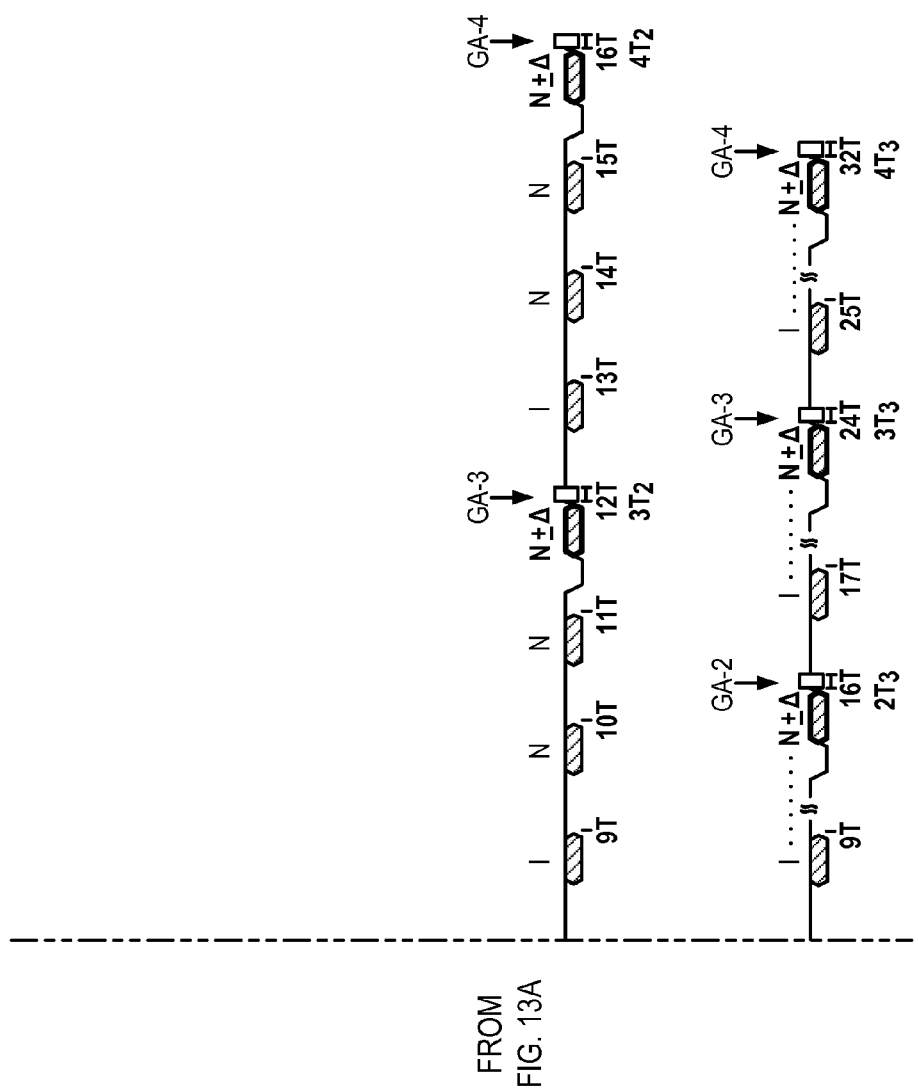

FIG. 13 illustrates exemplary input samples and the data ready signal for input sequences that can be used to interleave modulator and FGA gain and offset estimations for a single channel ADC (Low Data Rate) according to another embodiment of the present invention. In FIG. 13, the input samples which are highlighted in bold are processed in the foreground and triggers the data ready signal (DRDYB) and input samples which are unbolded are processed in the background and are invisible to the user.

Referring to FIG. 13, the ADC operates at a low data rate, the period for virtual channel insertion is much shorter than the period T for a single input sample conversion (T>>Tv). Thus, the effect of virtual channel insertion on the data rate of the ADC is minimal.

Table 1 below illustrates the effective data rates and the percentage reduction in data rates due to the virtual channel insertion for the modulator and FGA calibration in a single channel ADC.

|  | Data Rate, DR (sps) | Effective Data Rate, EDR (sps) | Data Rate Reduction (%) |
|---|---|---|---|
| High Data Rates | 214.65 | 107.33 | 50.00 |
| (T = T$_v$ = 4.66 ms) | 107.3 | 71.53 | 33.33 |
|  | 53.66 | 42.93 | 20.00 |
|  | 26.83 | 23.85 | 11.11 |
| Low Data Rates | 13.42 | 12.63 | 5.88 |
| (T = 74.51 ms, | 6.8 | 6.59 | 3.03 |
| T$_v$ = 4.66 ms) | 3.4 | 3.35 | 1.54 |
|  | 1.7 | 1.69 | 0.78 |

Figure 14B:
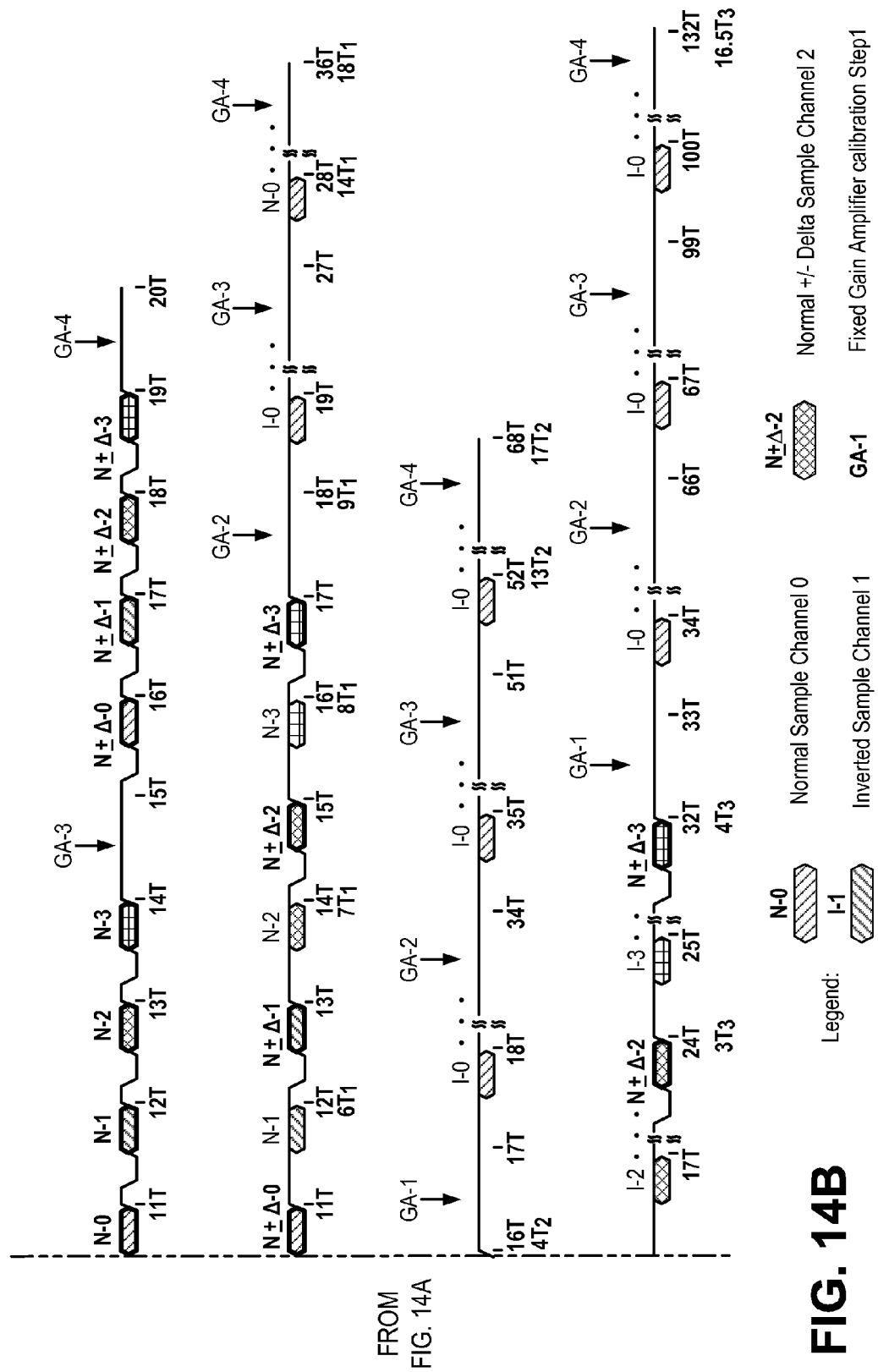
FIGS. 14 and 15, which include FIGS. 14A and 14B and FIGS. 15A and 15B, respectively, illustrate exemplary input samples and the data ready signal for input sequences that can be used to interleave modulator and FGA gain and offset estimations for a multi-channel ADC (High and Low Data Rates respectively) according to alternate embodiments of the present invention.
Figures 15, 15A:
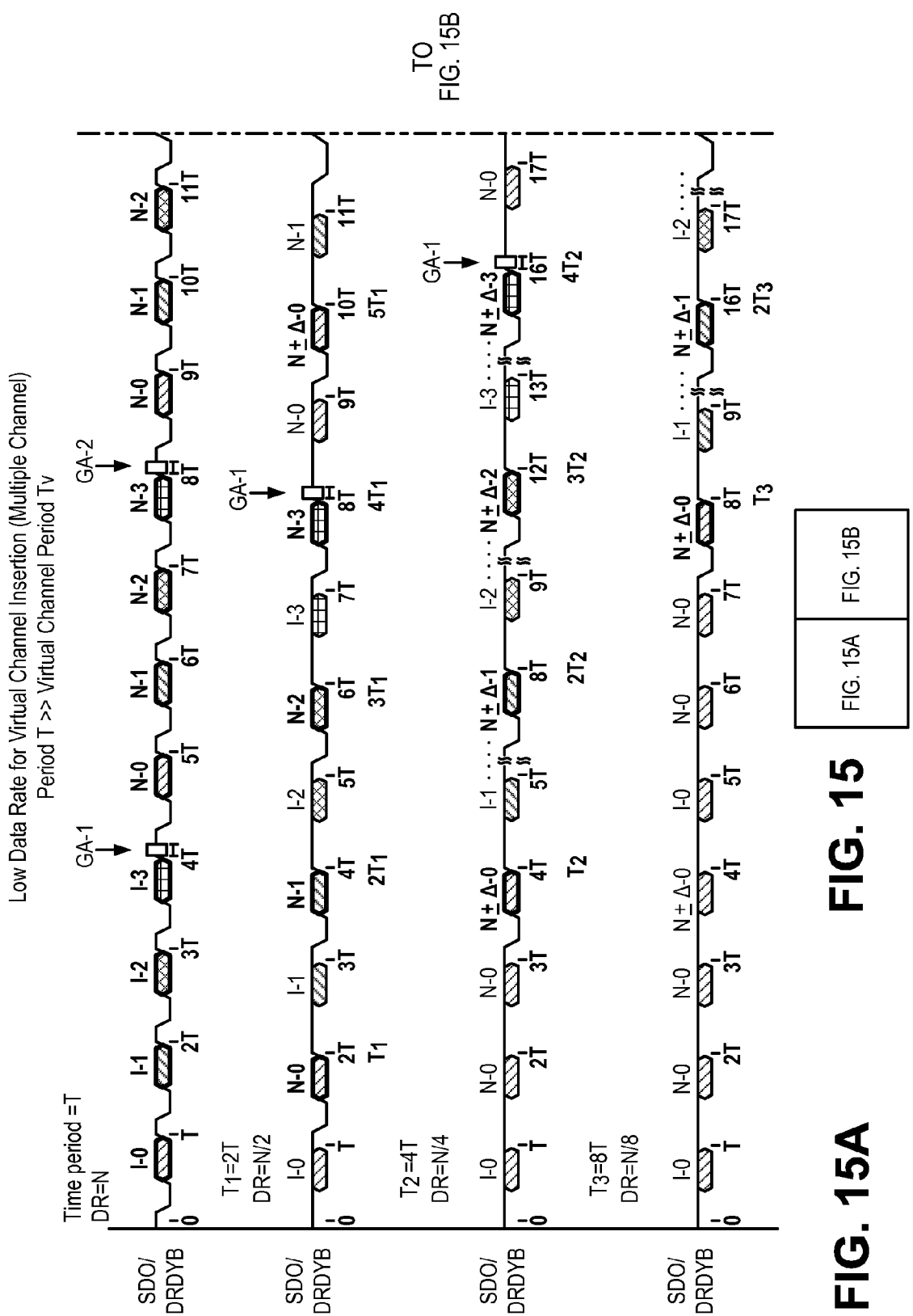
Figure 15B:
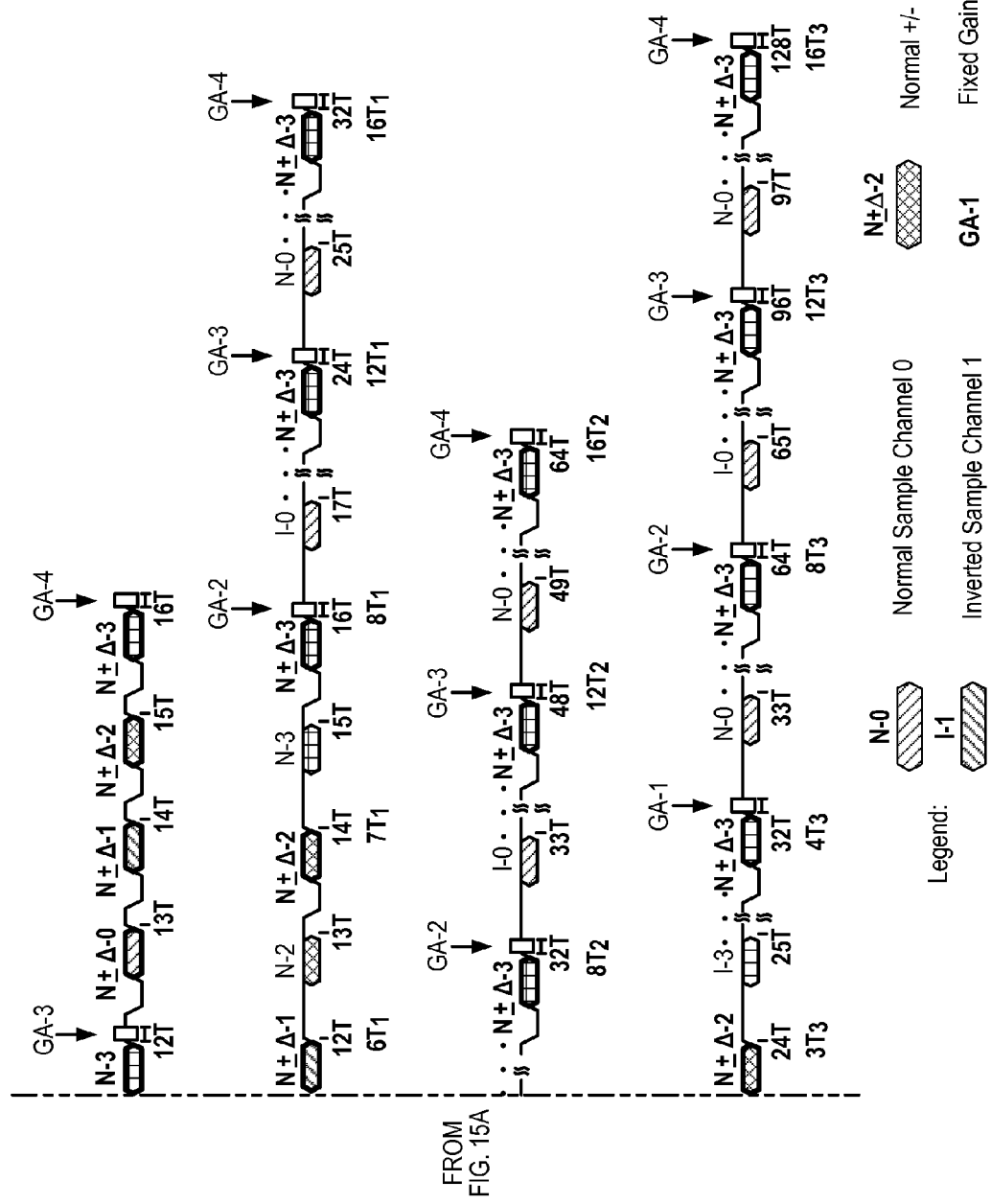

The interleaving of the modulator calibration steps and the FGA calibration steps can also be implemented in an ADC with multiple input channels. FIGS. 14 and 15 illustrate exemplary input samples and the data ready signal for input sequences that can be used to interleave modulator and FGA gain and offset estimations for a multi-channel ADC (High and Low Data Rates respectively) according to alternate embodiments of the present invention. In the present illustrations, the interleaving technique is demonstrated for 4 input channels but the same interleaving technique can be extended to any number of input channels in other embodiments of the present invention.

Referring to FIG. 14, at the highest data rate DR=N, the first inverted input samples for all input channels (I-0 to I-3) are processed and then the FGA calibration step 1 (GA-1) is inserted. Then, the normal samples for all the channels (N-0 to N-3) are processed followed by insertion of the second FGA calibrations step (GA-2). Then, the normal sample for all the channels (N-0 to N-3) are processed followed by the third FGA calibration step (GA-3). Finally, the samples (N±Δ$_x$-0 to N±Δ$_x$-3) are processed followed by the fourth FGA calibration step (GA-4). Accordingly, it takes 20 sample conversions to get a single estimate of the modulator and FGA, offset and gain estimates. A data rate reduction of about 20% is observed.

For the next data rate (DR=N/2), the converter is still running at the highest data rate and the processing for background calibration is also done at the highest data rate. Accordingly, it takes 16T and 4Tv to perform a single FGA calibration and two modulator calibrations. The data rate reduction is only about 11%. The reduction in data rate is minimized further for lower data rates.

Referring to FIG. 13, when the ADC operates at a low data rate, the period for virtual channel insertion is much shorter than the period T for a single input sample conversion (T>>Tv). Thus, the effect of virtual channel insertion on the data rate of the ADC is minimal. The effective data rate comes close to the actual data rate without virtual channel insertion.

Table 2 below illustrates the effective data rates and the percentage reduction in data rates due to the virtual channel insertion for the modulator and FGA calibration in a multi-channel ADC.

|  | Data Rate, DR (sps) | | Effective Data Rate, EDR (sps) | | Data Rate Reduction (%) |
|---|---|---|---|---|---|
|  | Total | Per channel | Total | Per channel |  |
| High Data Rates | 214.65 | 53.6625 | 171.72 | 42.93 | 20 |
| (T = T$_v$ = 4.66 ms) | 107.3 | 26.825 | 95.38 | 23.84 | 11.11 |
|  | 53.66 | 13.415 | 50.50 | 12.63 | 5.88 |
|  | 26.83 | 6.7075 | 26.02 | 6.5 | 3.03 |
| Low Data Rates | 13.42 | 3.355 | 13.21 | 3.3 | 1.54 |
| (T = 74.51 ms, | 6.8 | 1.7 | 6.75 | 1.69 | 0.78 |
| T$_v$ = 4.66 ms) | 3.4 | 0.85 | 3.39 | 0.85 | 0.39 |
|  | 1.7 | 0.425 | 1.7 | 0.42 | 0.19 |

FGA Gain Estimation Noise Filtering

During FGA gain estimation process, an additional noise term appears due to the FGA and modulator noise. This noise in the FGA gain correction factor ($K_f$) gets amplified by the FGA gain and appears at the output. So, before this is used for the calibration of the digital output codes, it becomes necessary to suppress the noise of $K_f$ using filtering techniques. According to one embodiment of the present invention, several FGA gain error measurements are obtained and then filtering is applied to the measurements. The filtered output is then used for the calibration of the digital output codes. In one embodiment, a CIC (cascade-integrator-cascade) filter is used to filter the FGA gain error estimates. The length of the CIC filter is selected such that the noise of the calibrated digital output codes is of the order of the modulator noise.

ADC with Moving Average

Resolution of ΣΔ Incremental ADCs can be improved by taking average of many samples. However, it will result in a data rate reduction directly proportional to the number of samples being averaged. To improve on the data rates as well, a moving average technique can be used.

For instance, let M represent the oversampling ratio of a single stage of digital sinc filter (e.g. 256). Without moving average, it takes 4M (oversampling ratio=1024 for 4$^{th}$ order sinc filter) clock cycles for every sample to be converted. So, when two such samples are averaged to give a better resolution, it takes 8M clock cycles for a single conversion. Hence, the effective data rate goes down by 2. Similarly, when average of 4 samples is given out, it takes 16M clock cycles and effective data rate goes down by a factor of 4.

With the moving average technique, after an initial latency of 3M clock cycles (required to fill the digital filter stages initially), the output samples will be ready every (n×M) clock cycles where n is the number of averages taken. According to embodiments of the present invention, the FGA background calibration method is applied in an ADC employing moving average to increase the data rate.

Figure 16:
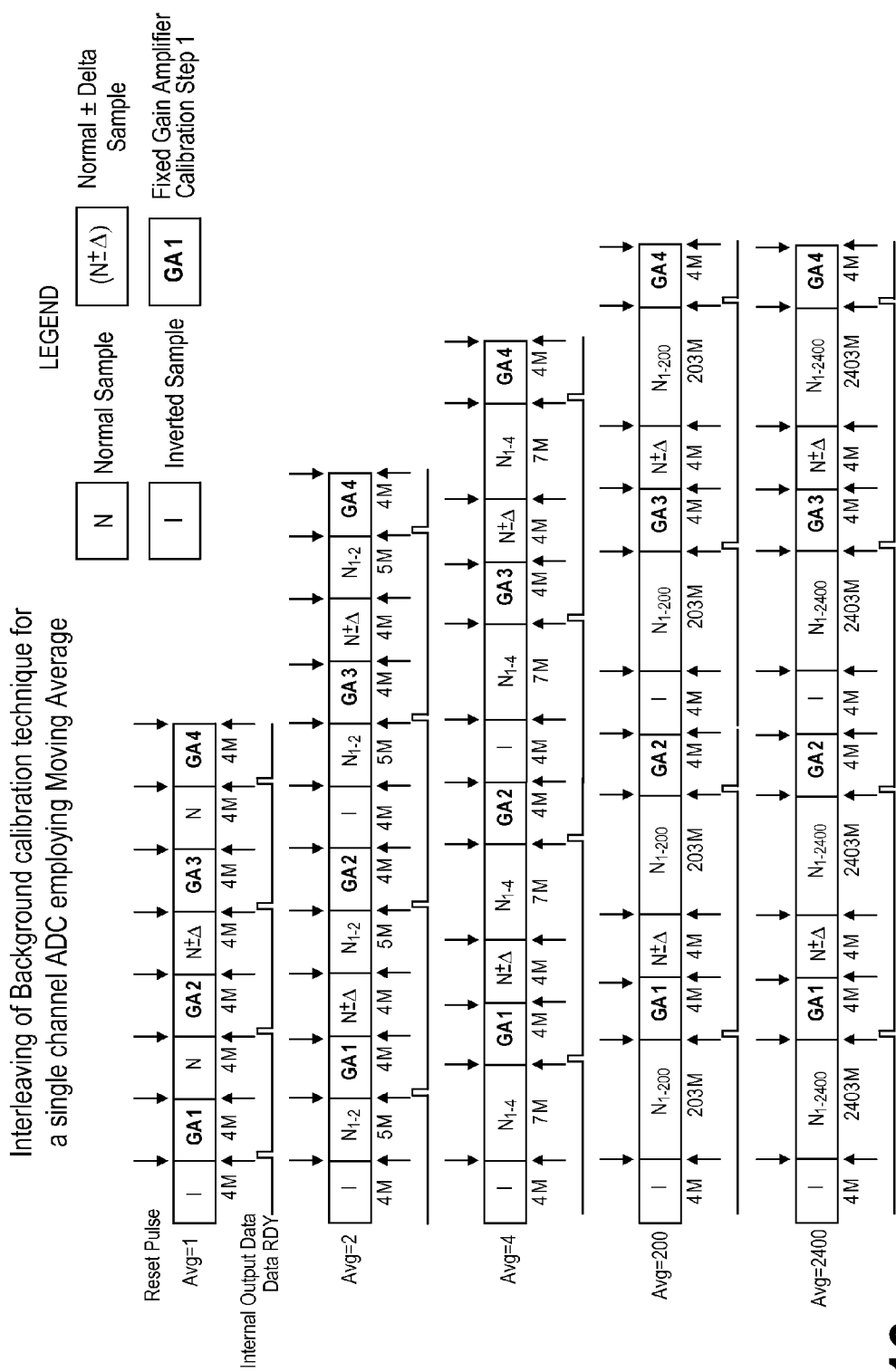
FIG. 16 illustrates exemplary input samples and the data ready signal for input sequences that can be used to interleave modulator and FGA gain and offset estimations for a single-channel ADC employing moving average according to one embodiment of the present invention.

The sample interleaving for an ADC employing moving average can be accomplished in many different ways. FIG. 16 illustrates exemplary input samples and the data ready signal for input sequences that can be used to interleave modulator and FGA gain and offset estimations for a single-channel ADC employing moving average according to one embodiment of the present invention. Referring to FIG. 16, when 200 samples are averaged, first sample is inverted (=4M cycles) before conversion and then 200 Normal samples are converted (203 cycles). Average of these 200 samples is given out to the user as 'Data RDY' signal goes high. Offset can be estimated using the inverted and the first normal sample $(I+N_1)/2$. Then, first step of FGA Gain estimation GA1 (4M) cycle is inserted. Now, similarly, a (N±Δ) (4M cycles) symbol is inserted followed by 200 normal samples. Modulator gain can now be calculated using the (N±Δ) and the first normal sample $N_1$. The second FGA Gain estimation step GA2 is now inserted, and so on.

The sample interleaving can also be applied to a multi-channel ADC employing moving average. The methodology is similar to the multiple channel cases described with reference to FIGS. 14 and 15 and also the moving average case described with reference to FIG. 16.

Alternate Modulator Calibration Method

In the above description, the FGA calibration method is interleaved with the modulator calibration method described in the parent '797 application. In other embodiments of the present invention, the background calibration method for a FGA can be interleaved with other methods of modulator calibration. According to embodiments of the present invention, the offset error of a modulator is estimated by shorting the ADC input to ground and the gain error of a modulator is estimated by applying a small known voltage "Δ" to the ADC input. Using the shorted input ("SI") sample and the voltage Δ ("Δ") sample, the slope of the ADC transfer characteristics is calculated which provides an indication of the actual gain of the ADC.

Figures 17, 17A:
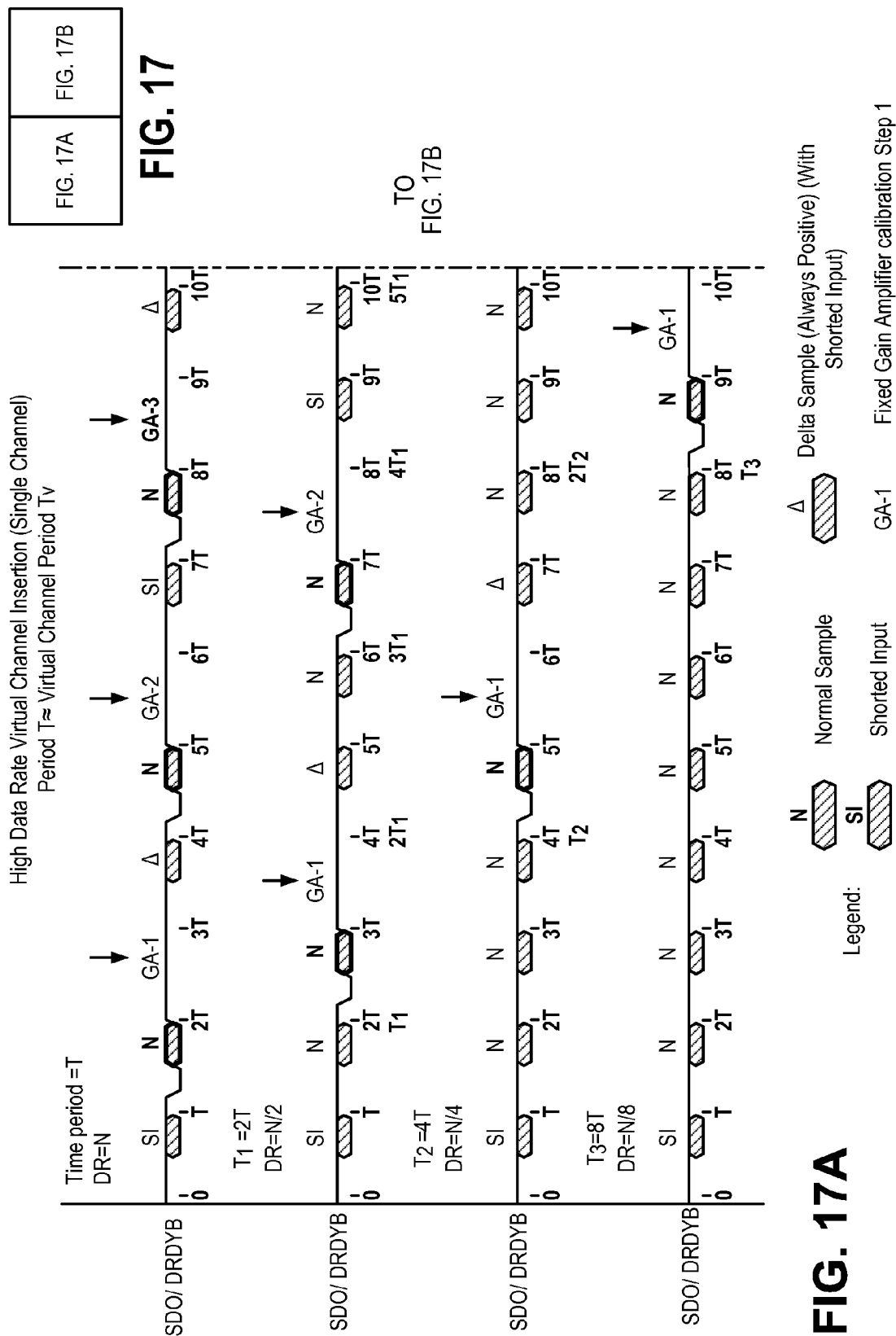
FIG. 17, which includes
FIGS. 17A and 17B, illustrates exemplary input samples and the data ready signal for input sequences that can be used to interleave modulator and FGA gain and offset estimations for a single-channel ADC (High Data Rate) according to an alternate embodiment of the present invention.
Figure 17B:
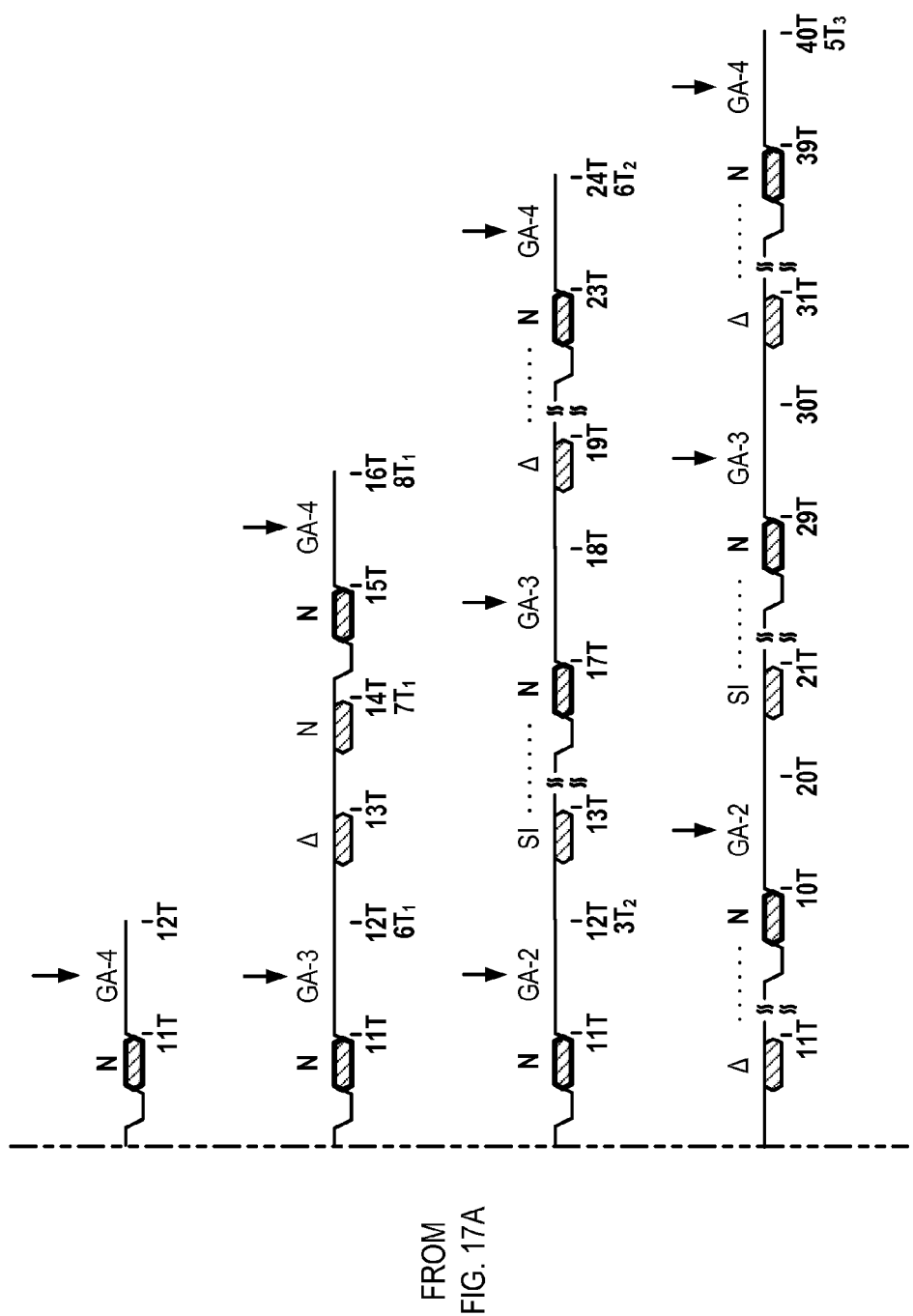

In one embodiment, the FGA calibration method described above is interleaved with the "SI and Δ" modulator calibration samples. FIG. 17 illustrates exemplary input samples and the data ready signal for input sequences that can be used to interleave modulator and FGA gain and offset estimations for a single-channel ADC (High Data Rate) according to an alternate embodiment of the present invention. Referring to FIG. 17, in between the actual conversions, 'SI' and 'Δ' samples are interleaved for modulator gain and offset estimation and steps GA-1 to GA-4 are inserted for FGA gain estimation respectively. Since FGA gain estimation steps are inserted at the highest possible data rate, the time spent for FGA Gain estimation reduces with the data rate. For the smallest data rate, it becomes an insignificant fraction of the actual conversion period.

The interleaving of FGA calibration with "SI and Δ" modulator calibration can also be applied to a multiple channel ADC in the same manner described above. For a multiplexed channel ADC, 'SI' and 'Δ' samples are inserted separately for each channel, however, the FGA Gain estimation steps GA-1 to GA-4 are inserted only once for all the multiplexed channels further improving the effective data rate.

The above detailed descriptions are provided to illustrate specific embodiments of the present invention and are not intended to be limiting. Numerous modifications and variations within the scope of the present invention are possible. The present invention is defined by the appended claims.

We claim:

1. A method for calibrating a fixed gain amplifier configured as a front-end amplification stage of an analog-to-digital converter, the analog-to-digital converter receiving an analog input signal and generating digital output codes indicative of the analog input signal, the method comprising:

generating a calibration voltage at the fixed gain amplifier;
sampling the calibration voltage to generate a first input sample at a first sampling interval with the fixed gain amplifier bypassed;
reversing the polarity of the calibration voltage;
sampling the inversed polarity calibration voltage to generate a second input sample at a second sampling interval with the fixed gain amplifier bypassed;
generating a first offset corrected digital output code being half of the difference of the digital output codes associated with the first and second input samples;
sampling the calibration voltage to generate a third input sample at a third sampling interval through the fixed gain amplifier;
reversing the polarity of the calibration voltage;
sampling the inversed polarity calibration voltage to generate a fourth input sample at a fourth sampling interval through the fixed gain amplifier;
generating a second offset corrected digital output code being half of the difference of the digital output codes associated with the third and fourth input samples;
computing an actual gain value of the fixed gain amplifier from the ratio of the second offset corrected digital output code to the first offset corrected digital output code; and
generating a gain correction value for the fixed gain amplifier being the ratio of an ideal gain to the actual gain value of the fixed gain amplifier.

2. The method of claim 1, further comprising:
generating a plurality of gain correction values over a plurality of sampling intervals;
filtering the plurality of gain correction values to generate an averaged gain correction value; and
applying the averaged gain correction value to calibrate the digital output codes of the analog-to-digital converter.

3. The method of claim 2, wherein the filtering step comprises:
filtering the plurality of gain correction values using a CIC (cascade-integrator-cascade) filter to generate the filtered gain correction value.

4. The method of claim 1, wherein the steps of sampling the calibration voltage and sampling the inversed polarity calibration voltage are performed as background operations of the analog-to-digital converter.

5. The method of claim 1, wherein the analog-to-digital converter further comprises a modulator and the method further for calibrating the modulator using a plurality of input samples including input samples with normal polarities, input samples with inversed polarities, input samples with unmodified magnitude and input samples with modified magnitude, the method further comprising:
interleaving the first, second, third and fourth input samples in between the plurality of input samples for calibrating the modulator.

6. The method of claim 5, wherein the first, second, third and fourth sampling intervals are configured to operate at the highest data rate of the analog-to-digital converter.

7. The method of claim 5, wherein the analog-to-digital converter comprises a multichannel analog-to-digital converter receiving a plurality of analog input signals, the method further comprising:
calibrating the modulator using a plurality of input samples from each channel, the input samples including input samples with normal polarities, input samples with inversed polarities, input samples with unmodified magnitude and input samples with modified magnitude; and interleaving the first, second, third and fourth input samples in between the plurality of input samples for calibrating the modulator.

8. The method of claim 5, wherein the analog-to-digital converter implements a moving average scheme, the method further comprising:
interleaving the first, second, third and fourth input samples in between groups of samples to be averaged for calibrating the modulator.

9. The method of claim 1, wherein the analog-to-digital converter further comprises a modulator and the method further for calibrating the modulator using a plurality of input samples including shorted input samples, and input samples with modified magnitude, the method further comprising:
interleaving the first, second, third and fourth input samples in between the plurality of input samples for calibrating the modulator.

10. The method of claim 1, further comprising:
shorting an input terminal to an output terminal of the fixed gain amplifier to bypass the fixed gain amplifier.

11. The method of claim 1, wherein generating a calibration voltage at the fixed gain amplifier comprises:
generating the calibration voltage using a voltage divider coupled between a positive power supply voltage and ground.

12. The method of claim 1, wherein the calibration voltage has a value being the full-scale output voltage of the fixed gain amplifier divided by the ideal gain of the fixed gain amplifier and evaluated at a minimum level of a positive power supply value.

13. A method for calibrating an analog-to-digital converter including a fixed gain amplifier configured as a front-end amplification stage and a modulator, the analog-to-digital converter receiving an analog input signal and generating digital output codes indicative of the analog input signal, the method comprising:
generating an offset correction value and a modulator gain correction value;
wherein generating the offset correction value comprises:
sampling the analog input signal at a plurality of sampling intervals at an input of the fixed gain amplifier to generate an input sample for each sampling interval;
reversing the polarity of at least one input sample;
generating digital output codes indicative of the input samples at an output of the modulator;
averaging the digital output codes associated with a first pair of input samples, the first pair of input samples having opposite polarities;
generating the offset correction value being the average of the digital output codes associated with the first pair of input samples, the offset correction value correcting for at least offset errors in the fixed gain amplifier and in the modulator;
and wherein generating the modulator gain correction value comprises:
calibrating the modulator using a plurality of input samples including input samples with unmodified magnitude and input samples with modified magnitude; and
computing an actual gain value of the modulator using the digital output codes associated with an input sample with unmodified magnitude and another input sample with modified magnitude; and
generating the modulator gain correction value being the ratio of an ideal gain of the modulator to the actual gain of the modulator.

14. The method of claim 13, further comprising:
subtracting the offset correction value from each digital output code to generate an offset error corrected digital output value indicative of the analog input signal.

15. The method of claim 14, wherein subtracting the offset correction value from each digital output code further comprises subtracting the offset correction value from each digital output code to generate an offset error corrected and even order non-linearity corrected digital output value indicative of the analog input signal.

16. The method of claim 13, wherein the analog-to-digital converter further comprises an input buffer configured between the fixed gain amplifier and the modulator, wherein the step of generating an offset correction value comprises:
generating an offset correction value being the average of the digital output codes associated with the first pair of input samples, the offset correction value correcting for at least offset errors in the fixed gain amplifier, the input buffer and in the modulator.

17. The method of claim 13, further comprising generating a fixed gain amplifier gain correction value by:
sampling the calibration voltage to generate a first input sample at a first sampling interval with the fixed gain amplifier bypassed;
reversing the polarity of the calibration voltage;
sampling the inversed polarity calibration voltage to generate a second input sample at a second sampling interval with the fixed gain amplifier bypassed;
generating a first offset corrected digital output code being half of the difference of the digital output codes associated with the first and second input samples;
sampling the calibration voltage to generate a third input sample at a third sampling interval through the fixed gain amplifier;
reversing the polarity of the calibration voltage;
sampling the inversed polarity calibration voltage to generate a fourth input sample at a fourth sampling interval through the fixed gain amplifier;
generating a second offset corrected digital output code being half of the difference of the digital output codes associated with the third and fourth input samples;
computing an actual gain value of the fixed gain amplifier from the ratio of the second offset corrected digital output code to the first offset corrected digital output code; and
generating a fixed gain amplifier gain correction value for the fixed gain amplifier being the ratio of an ideal gain to the actual gain value of the fixed gain amplifier.

18. The method of claim 17, further comprising:
multiplying each offset error corrected digital output value by a product of the modulator gain correction factor and the fixed gain amplifier gain correction factor to generate a gain error corrected digital output value indicative of the analog input signal.

19. A method for calibrating an analog-to-digital converter including a fixed gain amplifier configured as a front-end amplification stage and a modulator, the analog-to digital converter receiving an analog input signal and generating digital output codes indicative of the analog input signal, the method comprising:
generating a calibration voltage;
sampling the calibration voltage at a plurality of sampling intervals at an input of the fixed gain amplifier to generate an input sample for each sampling interval;
reversing the polarity of at least one input sample;
generating digital output codes indicative of the input samples at an output of the modulator;

averaging the digital output codes associated with a first pair of input samples, the first pair of input samples having opposite polarities; and generating an offset correction value being the average of the digital output codes associated with the first pair of input samples, the offset correction value correcting for at least offset errors in the fixed gain amplifier and in the modulator.

* * * * *